US012190942B2

(12) United States Patent
Kim et al.

(10) Patent No.: US 12,190,942 B2
(45) Date of Patent: Jan. 7, 2025

(54) NONVOLATILE MEMORY DEVICE AND OPERATING METHOD WITH OPERATIONAL AMPLIFIER HAVING FEEDBACK PATH

(71) Applicant: Samsung Electronics Co., Ltd., Suwon-si (KR)

(72) Inventors: Seongjin Kim, Suwon-si (KR); Jayang Yoon, Suwon-si (KR); Chiweon Yoon, Seoul (KR); Cheonan Lee, Yongin-si (KR); Kichang Jang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 238 days.

(21) Appl. No.: 17/863,037

(22) Filed: Jul. 12, 2022

(65) Prior Publication Data

US 2023/0146885 A1    May 11, 2023

(30) Foreign Application Priority Data

Nov. 11, 2021  (KR) .......................... 10-2021-0154761
Feb. 17, 2022  (KR) .......................... 10-2022-0020548

(51) Int. Cl.
   *G11C 11/4099*   (2006.01)
   *G11C 11/4074*   (2006.01)
   *G11C 11/408*    (2006.01)

(52) U.S. Cl.
   CPC ...... *G11C 11/4099* (2013.01); *G11C 11/4074* (2013.01); *G11C 11/4085* (2013.01)

(58) Field of Classification Search
   CPC ............ G11C 11/4099; G11C 11/4074; G11C 11/4085; G11C 16/30; G11C 16/08; G11C 16/24; G11C 5/147; G11C 5/145
   See application file for complete search history.

(56) References Cited

U.S. PATENT DOCUMENTS 7,679,133 B2    3/2010  Son et al.
8,553,466 B2   10/2013  Han et al.
(Continued)

FOREIGN PATENT DOCUMENTS

CN    104297553 B  *  9/2017
CN    112740137 A     4/2021
JP      5487880 B2    5/2014

OTHER PUBLICATIONS

The Output Voltage Detection Circuit, The Control Circuit and the Switch-mode Converter (Year: 2017).*

(Continued)

*Primary Examiner* — Sultana Begum
(74) *Attorney, Agent, or Firm* — Muir Patent Law, PLLC

(57) ABSTRACT

According to the present disclosure, a nonvolatile memory device may include an operational amplifier comparing a reference voltage with a voltage of a feedback node; a first feedback network circuit generating a first output voltage by dividing an input voltage in response to an output voltage of the operational amplifier, and transmitting a voltage corresponding to the first output voltage to the feedback node in response to a first feedback signal, a second feedback network circuit generating a second output voltage by dividing the input voltage in response to the output voltage of the operational amplifier, and transmitting a voltage corresponding to the second output voltage to the feedback node in response to a second feedback signal, and a third feedback network circuit generating a third output voltage by dividing the input voltage in response to the output voltage of the operational amplifier, and transmitting a voltage corresponding to the third output voltage to the feedback node in response to a third feedback signal.

9 Claims, 31 Drawing Sheets

(56) References Cited

U.S. PATENT DOCUMENTS

| | | |
|---|---|---|
| 8,559,229 B2 | 10/2013 | Kim et al. |
| 8,559,235 B2 | 10/2013 | Yoon et al. |
| 8,654,587 B2 | 2/2014 | Yoon et al. |
| 8,705,273 B2 | 4/2014 | Kim et al. |
| 8,710,914 B1 | 4/2014 | Guhados et al. |
| 8,736,356 B2 | 5/2014 | Yoo |
| 9,165,669 B2 | 10/2015 | Nam et al. |
| 9,208,886 B2 | 12/2015 | Nam et al. |
| 9,378,828 B2 | 6/2016 | Nam et al. |
| 9,536,970 B2 | 1/2017 | Seol et al. |
| 9,552,886 B2 | 1/2017 | Nam et al. |
| 9,659,660 B2 | 5/2017 | Nam et al. |
| 10,936,001 B2 | 3/2021 | Du et al. |
| 11,004,513 B2 | 5/2021 | Vahidimowlavi et al. |
| 2009/0302815 A1* | 12/2009 | Tanzawa ................ G11C 5/145 307/31 |
| 2013/0162336 A1* | 6/2013 | Williams ................. G05F 3/16 327/536 |
| 2022/0413529 A1* | 12/2022 | Lee .......................... G05F 3/08 |

OTHER PUBLICATIONS

European Search Report issued Dec. 22, 2022 by the European Patent Office for corresponding patent application EP 22184399.8.

* cited by examiner

92

NONVOLATILE MEMORY DEVICE AND OPERATING METHOD WITH OPERATIONAL AMPLIFIER HAVING FEEDBACK PATH

CROSS-REFERENCE TO RELATED APPLICATION(S)

This application claims the benefit under 35 USC 119(a) of Korean Patent Application Nos. 10-2021-0154761 filed on Nov. 11, 2021 and 10-2022-0020548 filed on Feb. 17, 2022 in the Korean Intellectual Property Office, the entire disclosures of which is incorporated herein by reference for all purposes.

BACKGROUND

Aspects of the present invention concept relates to a nonvolatile memory device, a storage device having the same, and an operating method thereof.

In general, storage devices having a nonvolatile memory device have been widely used in a universal serial bus (USB) drive, a digital camera, a mobile phone, a smart phone, a tablet, a PC, a memory card, a solid state drive (SSD), and the like. The storage devices are usefully used to store or move a large amount of data. Recently, the storage devices have been miniaturized and implemented in an embedded form in electronic devices.

SUMMARY

According to example embodiments, a nonvolatile memory device includes an operational amplifier comparing a reference voltage with a voltage of a feedback node, a first feedback network circuit generating a first output voltage by dividing an input voltage in response to an output voltage of the operational amplifier, and transmitting a voltage corresponding to the first output voltage to the feedback node in response to a first feedback signal, a second feedback network circuit generating a second output voltage by dividing the input voltage in response to the output voltage of the operational amplifier, and transmitting a voltage corresponding to the second output voltage to the feedback node in response to a second feedback signal, and a third feedback network circuit generating a third output voltage by dividing the input voltage in response to the output voltage of the operational amplifier, and transmitting a voltage corresponding to the third output voltage to the feedback node in response to a third feedback signal.

According to example embodiments, a method of operating a nonvolatile memory device includes setting a common phase of regulators sharing an operational amplifier by dividing the input voltage, setting each divided phase of the regulators using the operational amplifier to generate an output voltage, and applying output voltages of the regulators corresponding to wordline areas.

According to example embodiments, a storage device includes at least one nonvolatile memory device, and a controller controlling the at least one nonvolatile memory device, in which the at least one nonvolatile memory device includes a plurality of memory blocks having a plurality of pages connected to wordlines and bitlines, a zone voltage generator generating zone voltages corresponding to zones in which the wordlines are divided into a plurality of areas, and a control logic controlling the zone voltage generator during a programming operation, a read operation, or an erase operation, and the zone voltage generator includes regulators sharing an operational amplifier, sequentially output corresponding feedback voltages to the operational amplifier to generate the zone voltages, and apply the zone voltages to corresponding zones.

According to example embodiments, a nonvolatile memory device includes a memory cell array including a plurality of memory blocks that have a plurality of memory cells connected to a plurality of wordlines and a plurality of bitlines, a row decoder selecting one of the plurality of wordlines in response to an address, a page buffer circuit having a plurality of page buffers connected to the plurality of bitlines, a voltage generation circuit generating wordline voltages to be applied to the plurality of wordlines, and a control logic receiving a command latch enable (CLE) signal, an address latch enable (ALE) signal, a chip enable (CE) signal, a write enable (WE) signal, a read enable (RE) signal, and a DQS signal through control pins, and performing a programming operation, a read operation, or an erase operation by latching a command or an address at an edge of the WE signal according to the CLE signal and the ALE signal, in which the voltage generating circuit includes a zone voltage generator generating zone voltages corresponding to zones in which the plurality of wordlines are divided into a plurality of wordline areas by repeating a feedback path connection to one operational amplifier, and applies the zone voltages to the corresponding zones.

According to example embodiments, a method of operating a nonvolatile memory device includes: generating a program/read voltage to be applied to a selected wordline; and generating pass voltages to apply to unselected wordlines from regulators sharing an operational amplifier; in which the regulators sequentially transmit a feedback voltage to the operational amplifier to generate the pass voltages, and apply each of the pass voltages to corresponding wordlines among the unselected wordlines.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, the contents of the present disclosure will be described clearly and in detail to the extent that a person of ordinary skill in the art may easily implement the present disclosure using the drawings.

A nonvolatile memory device, a storage device having the same, and an operating method thereof according to an example embodiment of the present disclosure may sequentially control output voltages of a plurality of voltage regulators with one operational amplifier (OP-AMP). In the nonvolatile memory device of the present disclosure, a chip size may be reduced by generating a plurality of wordline voltages for each zone using a single operational amplifier.

Figure 1:
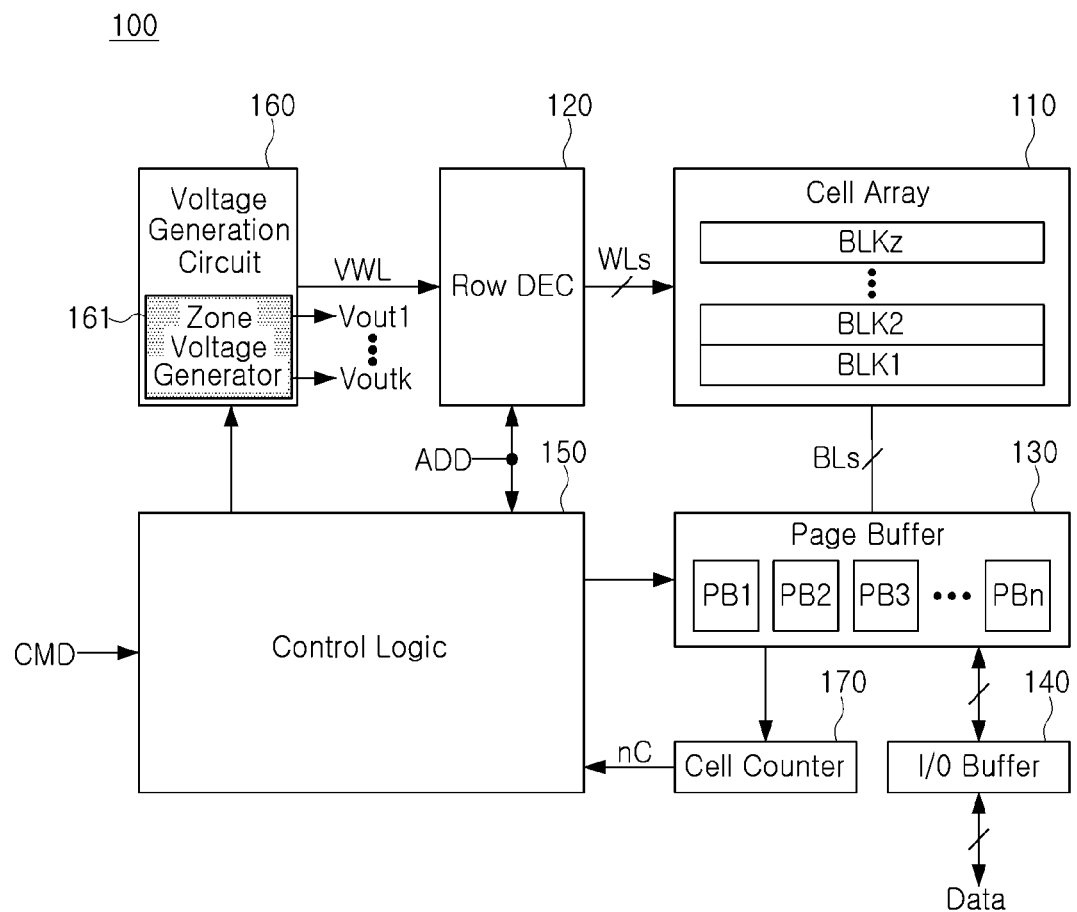
FIG. 1 is a diagram illustrating, by way of example, a nonvolatile memory device according to an example embodiment of the present disclosure.

FIG. 1 is a diagram illustrating, by way of example, a nonvolatile memory device 100 according to an example embodiment of the present disclosure. Referring to FIG. 1, the nonvolatile memory device 100 may include a memory cell array 110, a row decoder 120, a page buffer circuit 130, an input/output circuit 140, a control logic 150, a voltage generation circuit 160, and a cell counter 170.

The nonvolatile memory device 100 may be implemented to store data. The nonvolatile memory device 100 may include a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), and the like. Also, the nonvolatile memory device 100 may be implemented in a three-dimensional array structure. The present disclosure may be applicable not only to a flash memory device in which a charge storage layer is constituted by a conductive floating gate, but also to a charge trap flash (CTF) in which the charge storage layer is constituted by an insulating film. Hereinafter, for convenience of description, the nonvolatile memory device 100 will be referred to as a vertical NAND flash memory device (VNAND).

The memory cell array 110 may be connected to the row decoder 120 through wordlines WLs or select lines SSL and GSL. The memory cell array 110 may be connected to the page buffer circuit 130 through bitlines BLs. The memory cell array 110 may include a plurality of memory blocks BLK1 to BLKz, (where z is an integer greater than or equal to 2). Each of the plurality of memory blocks BLK1 to BLKz may include a plurality of cell strings. Each channel of the plurality of cell strings may be formed in a vertical or horizontal direction. Each of the cell strings may include a plurality of memory cells. Here, the plurality of memory cells may be programmed, erased, or read by a voltage provided to the bitlines BLs or the wordlines WLs. In general, the programming operation is performed on a page basis, and the erase operation is performed on a block basis. Details of the memory cell will be described in U.S. Pat. Nos. 7,679,133, 8,553,466, 8,654,587, 8,559,235, and 9,536,970, the entireties of which are incorporated herein by reference.

The row decoder 120 may be implemented to select one of the memory blocks BLK1 to BLKz of the memory cell array 110 in response to the address ADD. The row decoder 120 may select one of the wordlines of the selected memory block in response to the address ADD. The row decoder 120 may transmit a wordline voltage VWL corresponding to the operation mode to the wordline of the selected memory block. During a programming operation, the row decoder 120 may apply a program voltage and a verify voltage to the selected wordline, and may apply a pass voltage to the unselected wordline. During the read operation, the row decoder 120 may apply a read voltage to the selected wordline, and may apply a read pass voltage to the unselected wordline.

The page buffer circuit 130 may be implemented to operate as a write driver or a sense amplifier. During the programming operation, the page buffer circuit 130 may apply a bitline voltage corresponding to data to be programmed to the bitlines of the memory cell array 110. During a read operation or a verify read operation, the page buffer circuit 130 may detect data stored in the selected memory cell through the bitline BL. Each of the plurality of page buffers PB1 to PBn (n is an integer greater than or equal to 2) included in the page buffer circuit 130 may be connected to at least one bitline.

That is, each of the plurality of page buffers PB1 to PBn may perform at least one sensing operation to identify one state stored in the selected memory cells under the control of the control logic 150. In addition, after each of the plurality of page buffers PB1 to PBn stores data sensed through the plurality of sensing operations, one data may be selected under the control of the control logic 150. That is, each of the plurality of page buffers PB1 to PBn may perform a plurality of sensing operations to identify one state. Also, each of the plurality of page buffers PB1 to PBn may select or output optimal data from a plurality of sensed data under the control of the control logic 150.

The input/output circuit 140 may provide data provided from the outside to the page buffer circuit 130. The input/output circuit 140 may provide a command CMD provided from the outside to the control logic 150 (refer to FIG. 1). The input/output circuit 140 may provide an address ADD provided from the outside to the control logic 150 or the row decoder 120. In addition, the input/output circuit 140 may output data sensed and latched by the page buffer circuit 130 to the outside.

The control logic 150 may be implemented to control the row decoder 120, the page buffer circuit 130, or the voltage generation circuit 160 in response to the command CMD transmitted from the outside (controller).

The voltage generation circuit 160 may be implemented to generate various types of wordline voltages to be applied to each of the wordlines and a well voltage to be supplied to a bulk (e.g., well area) in which memory cells are formed under the control of the control logic 150. Wordline voltages applied to each of the wordlines may include a program voltage, a pass voltage, a read voltage, a read pass voltage, and the like. In an example embodiment, a voltage generator may be provided in each of the planes of the multi-plane VNAND. In another example embodiment, the planes may share one voltage generator.

Also, the voltage generation circuit 160 may be implemented to provide different wordline voltages (e.g., pass voltage/read pass voltage, etc.) for each zone (or for each wordline area). Here, a zone refers to a group of adjacent wordlines. In an example embodiment, the voltage generation circuit 160 may include a zone voltage generator 161.

The zone voltage generator 161 may be implemented to provide zone voltages (Vout1, . . . , Voutk, k is an integer greater than or equal to 2) corresponding to different zones. The zone voltage generator 161 may generate the zone voltages Vout1, . . . , Voutk by outputting the feedback voltages of the plurality of regulators to one operational amplifier (OP-AMP) under the control of the control logic 150. Here, each of the plurality of regulators may be connected to the operational amplifier, and may generate a corresponding zone voltage by dividing an input voltage, from a voltage source, by resistance.

The cell counter 170 may be implemented to count memory cells corresponding to a specific threshold voltage range from data sensed by the page buffer circuit 130. For example, the cell counter 170 may count the number of memory cells having a threshold voltage within the specific threshold voltage range by processing data sensed in each of the plurality of page buffers PB1 to PBn.

A typical nonvolatile memory device has a plurality of wordline voltage generators corresponding to driving a plurality of wordline areas (or for each zone).

The nonvolatile memory device 100 according to an example embodiment of the present disclosure may have a reduced chip size by configuring a feedback network of voltage regulators that output a plurality of zone voltages by sharing one operational amplifier.

Figure 2A:
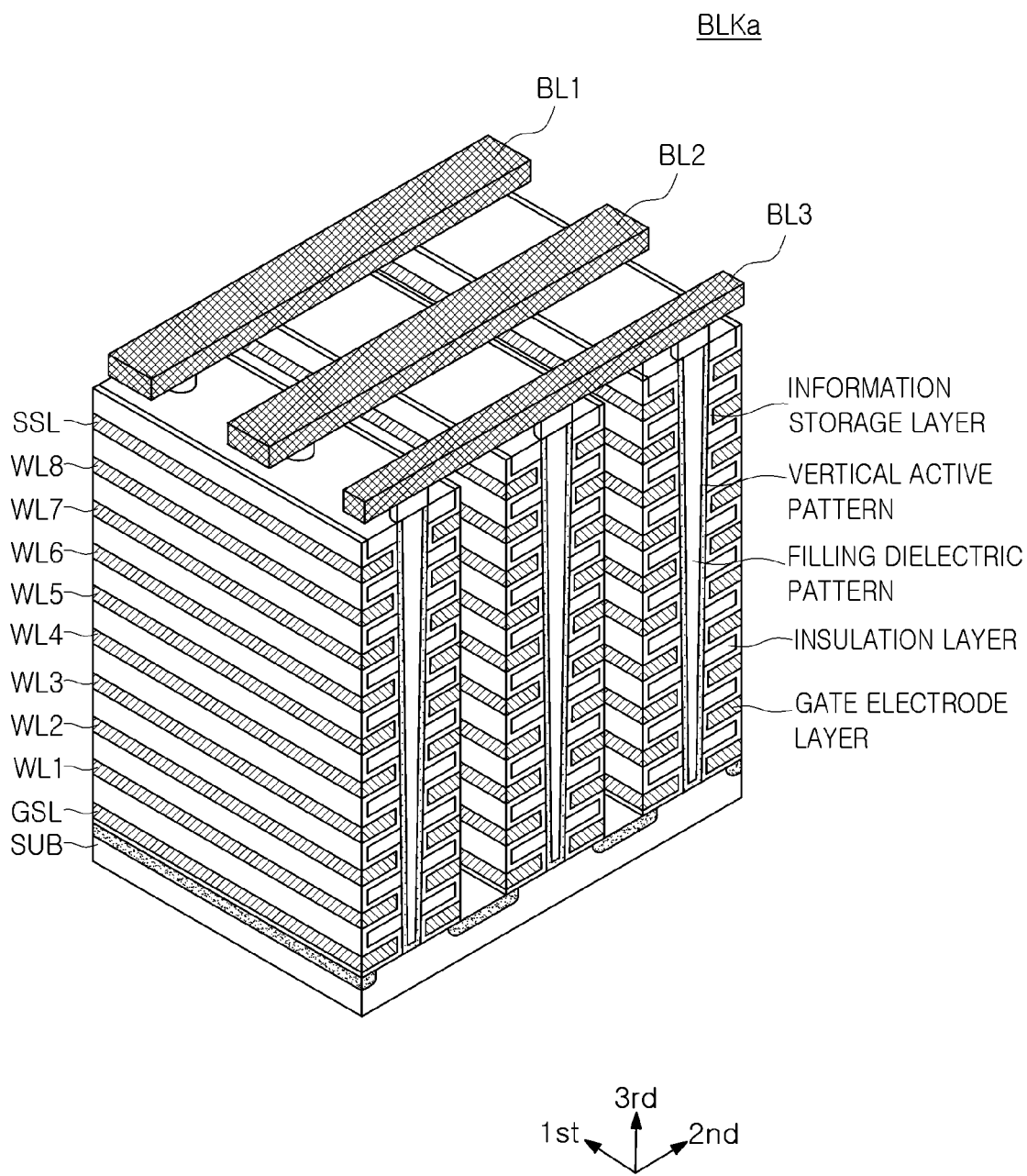
FIGS. 2A and 2B are diagrams illustrating, by way of example, a memory block according to an example embodiment of the present disclosure.

FIG. 2A is a diagram illustrating, by way of example, a circuit diagram of a memory block according to an example embodiment of the present disclosure. Referring to FIG. 2A, the memory block BLKa is formed in a direction perpendicular to a substrate SUB. An n+ doped area may be formed in the substrate SUB.

A gate electrode layer and an insulation layer may be alternately deposited on the substrate SUB. An information storage layer may be formed between the gate electrode layer and the insulation layer. When the gate electrode layer and the insulation layer are vertically patterned, a V-shaped pillar may be formed. The pillar may be connected to the substrate SUB through the gate electrode layer and the insulation layer. An inside of the pillar is a filling dielectric pattern and may be formed of an insulating material such as silicon oxide. An outside of the pillar is a vertical active pattern and may be formed of a channel semiconductor.

The gate electrode layer of the memory block BLKa may be connected to the ground select line GSL, the plurality of wordlines WL1 to WL8, and the string select line SSL. In addition, the pillar of the memory block BLK1 may be connected to the plurality of bitlines BL1 to BL3. In FIG. 2A, one memory block BLKa is illustrated as having two select lines GSL and SSL, eight wordlines WL1 to WL8, and three bitlines BL1 to BL3, but the present disclosure will not be limited thereto.

Figure 2B:
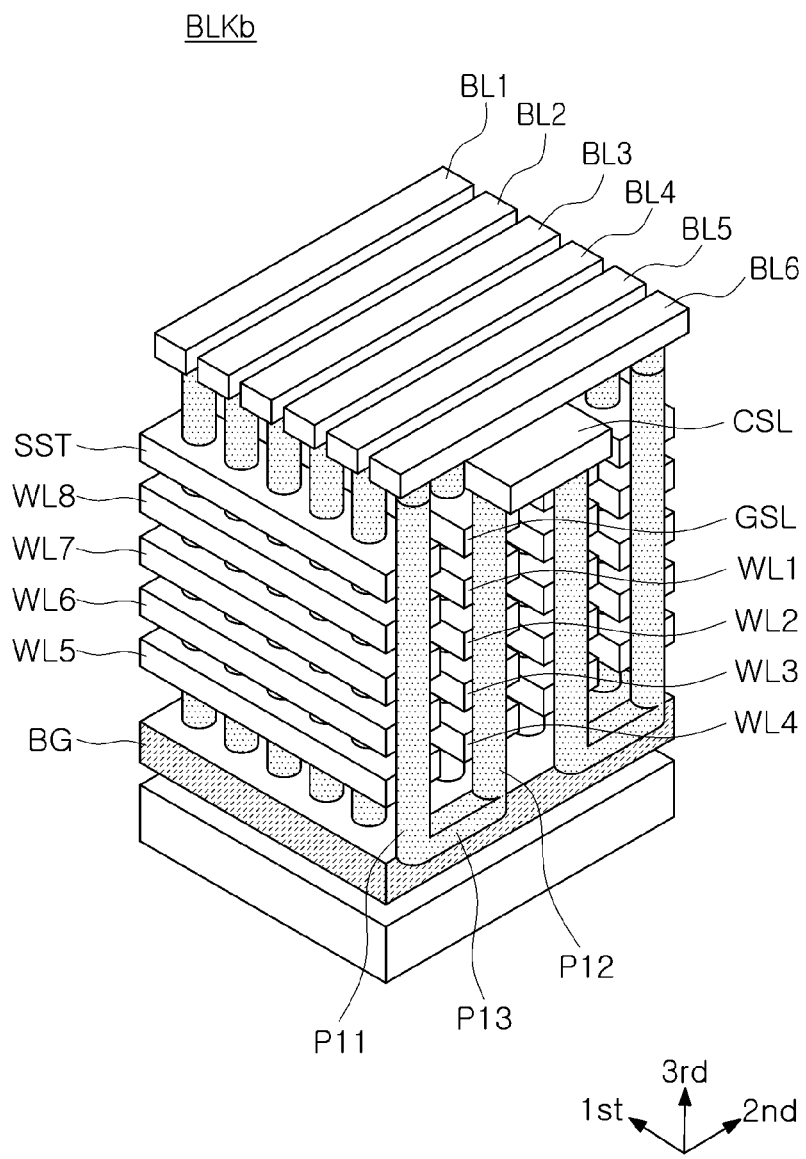

FIG. 2B is a diagram illustrating, by way of example, a memory block according to another example embodiment of the present disclosure. Referring to FIG. 2B, for convenience of description, in the memory block BLKb, the number of layers of the wordlines is four.

Each string NS may include series-connected memory cells MC1 to MC8. Here, first upper ends of the memory cells MC1 to MC8 may be connected to a string select transistor SST, second upper ends of the memory cells MC1 to MC8 may be connected to a ground select transistor GST, and lower ends of the memory cells MC1 to MC8 may be pipe-connected. Memory cells constituting the string NS may be formed by being stacked on a plurality of semiconductor layers. Each string NS may include a first pillar PL11, a second pillar PL12, and a pillar connection part PL13 connecting the first pillar PL11 and the second pillar PL12. The first pillar PL11 is connected to the bitline (e.g., BL6) and the pillar connection part PL13, and may be formed by passing between the string select line SSL and the wordlines WL5 to WL8. The second pillar PL12 may be connected to a common source line CSL and the pillar connection part PL13 and may be formed by passing between the ground select line GSL and the wordlines WL1 to WL4. As illustrated in FIG. 2B, the string NS may be implemented in the form of a U-shaped pillar.

In an example embodiment, a back-gate BG may be formed on the substrate, and the pillar connection part PL13 may be implemented inside the back-gate BG. In an example embodiment, the back-gate BG may exist in common in the block BLKb. The back-gate BG may have a structure separated from a back-gate of another block.

Figure 3:
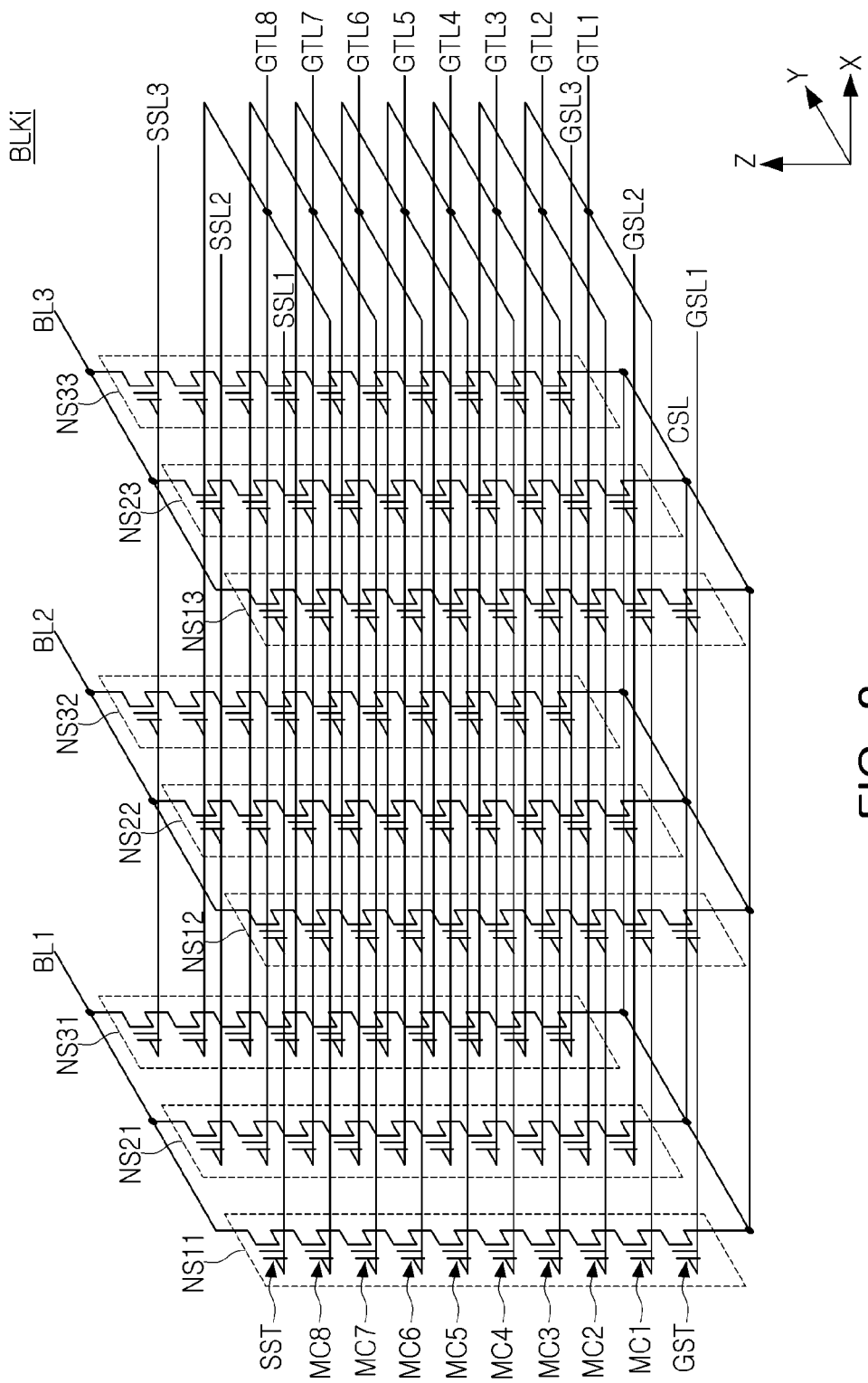
FIG. 3 is a diagram illustrating, by way of example, a circuit diagram of a memory block according to an example embodiment of the present disclosure.

FIG. 3 is a diagram illustrating, by way of example, a circuit diagram of a memory block BLKi (i is an integer greater than or equal to 2) according to an example embodiment of the present disclosure. A plurality of memory NAND strings included in the memory block BLKi may be formed in a direction perpendicular to the substrate.

Referring to FIG. 3, the memory block BLKi may include a plurality of memory NAND strings NS11 to NS33 connected between the bitlines BL1, BL2, and BL3 and the common source line CSL. Each of the plurality of memory NAND strings NS11 to NS33 may include the string select transistor SST, the plurality of memory cells MC1, MC2, . . . , MC8, and the ground select transistor GST. FIG. 3 illustrates that each of the plurality of memory NAND strings NS11 to NS33 includes eight memory cells MC1, MC2, . . . , MC8, but is not limited thereto.

The string select transistor SST may be connected to the corresponding string select lines SSL1, SSL2, and SSL3. The plurality of memory cells MC1, MC2, . . . , MC8 may be connected to corresponding gate lines GTL1, GTL2, . . . , GTL8, respectively. The gate lines GTL1, GTL2, . . . , GTL8 may correspond to wordlines, and some of the gate lines GTL1, GTL2, . . . , GTL8 may correspond to dummy wordlines. The ground select transistor GST may be connected to the corresponding ground select lines GSL1, GSL2, and GSL3. The string select transistor SST may be connected to the corresponding bitlines BL1, BL2, and BL3, and the ground select transistor GST may be connected to the common source line CSL.

Wordlines (e.g., WL1) having the same height are commonly connected, and the ground select lines GSL1, GSL2, and GSL3 and the string select lines SSL1, SSL2, and SSL3 may each be separated from each other. FIG. 3 illustrates that the memory block BLK is shown to be connected to eight gate lines GTL1, GTL2, . . . , GTL8 and three bitlines BL1, BL2, BL3, but is not limited thereto.

Figure 4:
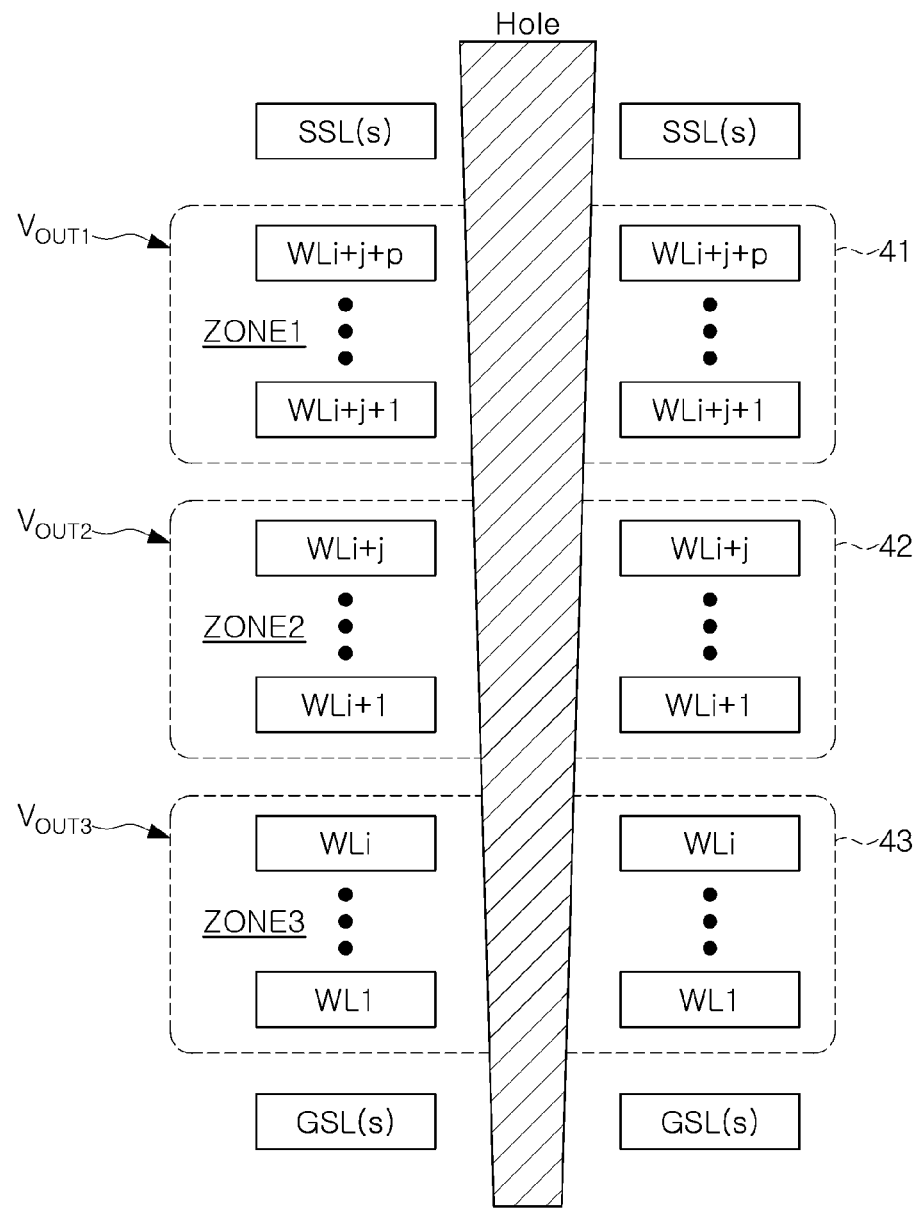
FIG. 4 is a diagram illustrating, by way of example, a wordline voltage for each wordline area according to an example embodiment of the present disclosure.

FIG. 4 is a diagram illustrating, by way of example, a wordline voltage for each wordline area according to an example embodiment of the present disclosure. Referring to FIG. 4, the wordline area may be divided into a plurality of zones 41, 42, and 43. Meanwhile, it is to be noted that the number of wordline areas is not limited thereto.

In general, in the wordlines of the VNAND memory structure, a difference in channel hole diameter occurs according to positions of each wordline. Accordingly, in order to overcome a difference in electrical characteristics, the wordline area is divided, and a level of a wordline voltage is controlled for each divided wordline area. Details of providing different wordline voltages for each wordline area will be described in U.S. Pat. Nos. 9,165,669, 9,208,886, 9,378,828, 9,552,886, and 9,659,660 (Sang-Wan Nam) filed by Samsung Electronics and incorporated by reference in their entirety in this application.

The first zone (ZONE1) 41 may include wordlines WLi+j+1 to WLi+j+p (where i, j, and p are integers greater than or equal to 2) disposed under the string select line SSL1. The second zone (ZONE2) 42 may include wordlines WLi+1 to WLi+j disposed under the first zone (ZONE1) 41. The third zone (ZONE2) 43 may include wordlines WL1 to WLi that are disposed above the ground select line GSL(s) and disposed under the second zone (ZONE2) 42.

As illustrated in FIG. 4, the first output voltage Vout1 may be applied to the first zone 41, the second output voltage Vout2 may be applied to the second zone 42, and the third output voltage Vout3 may be applied to the third zone 43.

Here, the output voltages Vout1, Vout2, and Vout3 may be output from the zone voltage generator 161 illustrated in FIG. 1.

In general, as the number of stacked stages of the VNAND memory increases, the number of voltage regulators connected to each wordline area also increases. Conventionally, each regulator is independently disposed to charge the wordline. The zone voltage generator according to an example embodiment of the present disclosure may be implemented in a structure in which an error amplifier is shared in order to reduce the overall size of the regulators. The zone voltage generator according to an example embodiment of the present disclosure may operate as a voltage regulator having a plurality of outputs. Each wordline area needs to operate at a separate target level. Accordingly, the zone voltage generator has an independent feedback network to output different levels. In an example embodiment, each feedback network may be connected to an error amplifier at the same time or for separate times.

Figure 5:
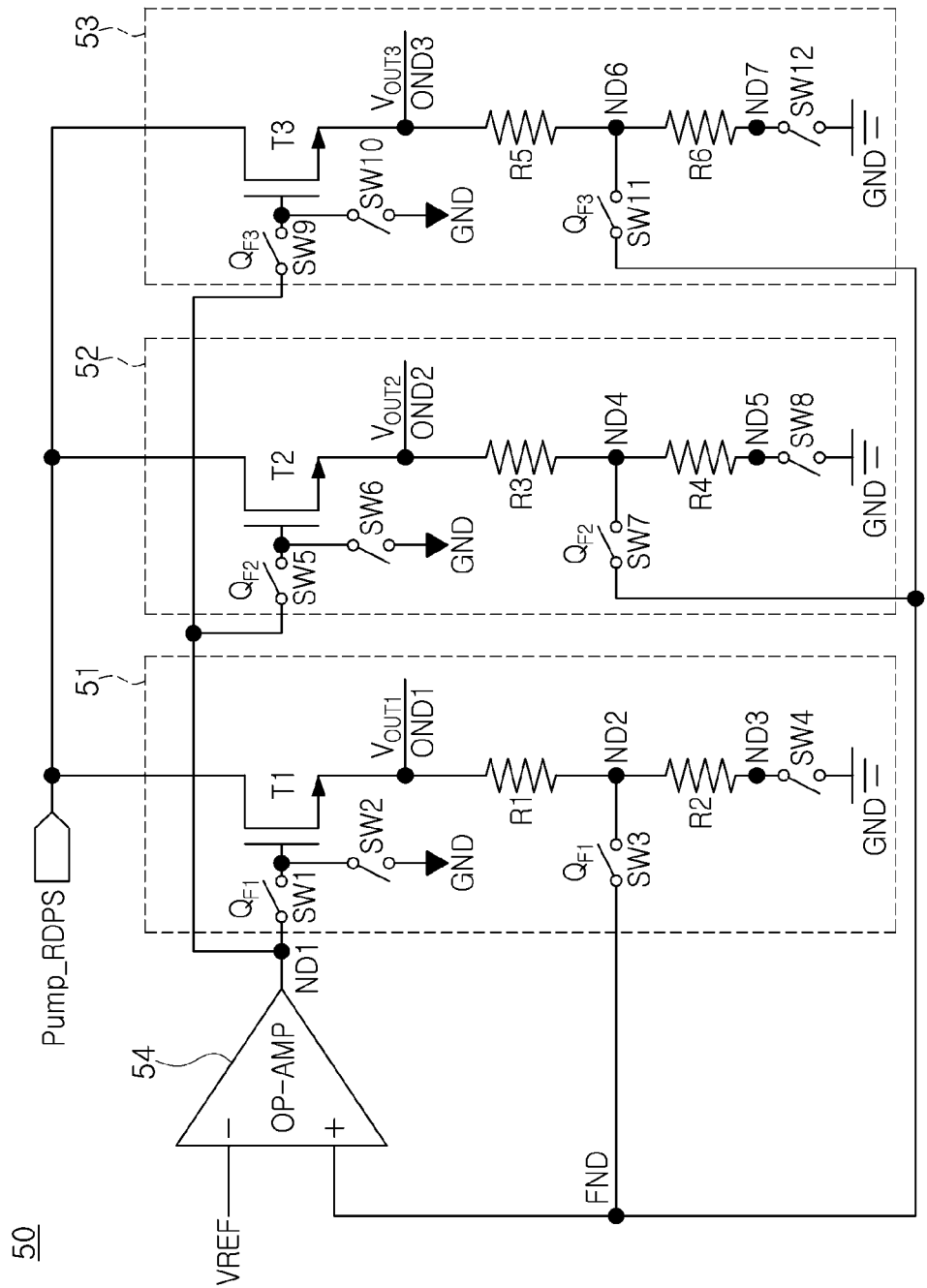
FIG. 5 is a diagram illustrating, by way of example, a zone voltage generator according to an example embodiment of the present disclosure.

FIG. 5 is a diagram illustrating, by way of example, a zone voltage generator 50 according to an example embodiment of the present disclosure. Referring to FIG. 5, the zone voltage generator 50 may include a first feedback network circuit 51, a second feedback network circuit 52, a third feedback network circuit 53, and an operational amplifier 54.

Each of the first feedback network circuit 51, the second feedback network circuit 52, and the third feedback network circuit 53 may be implemented to independently output a feedback voltage to one operational amplifier 54. Here, the feedback voltage is a voltage obtained by dividing an input voltage, from a voltage source, by resistance. As illustrated in FIG. 5 and as discussed in further detail below, the input voltage may be a charge pump voltage ("pump voltage") generated by a charge pump and provided through pump power terminal Pump_RDPS. However, although not illustrated, the input voltage may be a voltage generated by other DC-DC converter means.

The first feedback network circuit 51 may include a first transistor T1, a first resistor R1, a second resistor R2, a first switch SW1, a second switch SW2, a third switch SW3, and a fourth switch SW4.

The first transistor T1 may be connected between a pump power terminal Pump_RDPS and a first output node OND1. Here, the pump power terminal Pump_RDPS may receive a pump voltage as an input voltage. Here, the pump voltage (or "charge pump voltage") may be generated by boosting a voltage in synchronization with a clock in a charge pump which is a switch type mode power supply that uses capacitors to achieve higher voltages. Details of the charge pump and the pump voltage will be described in U.S. Pat. Nos. 8,559,229 and 8,705,273 (Moo Seong, Kim) filed by Samsung Electronics and incorporated by reference in their entirety in this application. The first output node OND1 may output the first output voltage VOUT1. The first resistor R1 may be connected between the first output node OND1 and a second node ND2. The second resistor R2 may be connected between the second node ND2 and a third node ND3.

The first switch SW1 may be connected between the first node ND1 and a gate of the first transistor T1. Here, the first node ND1 may include an output terminal of the operational amplifier 54. The second switch SW2 may be connected between the gate of the first transistor T1 and a ground terminal GND. The second switch SW2 may be used to discharge a gate voltage of the first transistor T1. The third switch SW3 may be connected between a feedback node FND and the second node ND2. Here, the feedback node FND may be connected to the positive voltage terminal (+) of the operational amplifier 54. The third switch SW3 may provide a first feedback voltage of the first feedback network circuit 51 to the positive voltage terminal (+) of the operational amplifier 54. Here, the first feedback voltage is a voltage of the second node ND2, and may be generated due to voltage division between the first resistor R1 and the second resistor R2. The fourth switch SW4 may be connected between the gate of the first transistor T1 and a ground terminal GND.

The second feedback network circuit 52 includes a second transistor T2, a third resistor R3, a fourth resistor R4, a fifth switch SW5, a sixth switch SW6, and a seventh switch SW7, and an eighth switch SW8.

The second transistor T2 may be connected between the pump power terminal Pump_RDPS and a second output node OND2. Here, the second output node OND2 may output the second output voltage VOUT2. The third resistor R3 may be connected between the second output node OND2 and a fourth node ND4. The fourth resistor R4 may be connected between the fourth node ND4 and a fifth node ND5.

The fifth switch SW5 may be connected between the first node ND1 and a gate of the second transistor T2. The sixth switch SW6 may be connected between the gate of the second transistor T2 and the ground terminal GND. The sixth switch SW6 may be used to discharge a gate voltage of the second transistor T2. The seventh switch SW7 may be connected between the feedback node FND and the fourth node ND4. The seventh switch SW7 may provide a second feedback voltage of the second feedback network circuit 52 to the positive voltage terminal (+) of the operational amplifier 54. Here, the second feedback voltage is a voltage of the fourth node ND4, and may be generated due to voltage division between the third resistor R3 and the fourth resistor R4. The eighth switch SW8 may be connected between the fifth node ND5 and the ground terminal GND.

The third feedback network circuit 53 may include a third transistor T3, a fifth resistor R5, a sixth resistor R6, a ninth switch SW9, a tenth switch SW10, an eleventh switch SW11, and a twelfth switch SW12.

The third transistor T3 may be connected between the pump power terminal Pump_RDPS and a third output node OND3. Here, the third output node OND3 may output the third output voltage VOUT3. The fifth resistor R5 may be connected between the third output node OND3 and a sixth node ND6. The sixth resistor R6 may be connected between the sixth node ND6 and a seventh node ND7.

The ninth switch SW9 may be connected between the first node ND1 and a gate of the third transistor T3. The tenth switch SW10 may be connected between the gate of the third transistor T3 and the ground terminal GND. The tenth switch SW10 may be used to discharge a gate voltage of the third transistor T3. The eleventh switch SW11 may be connected between the feedback node FND and the sixth node ND6. The eleventh switch SW11 may provide a third feedback voltage of the third feedback network circuit 53 to the positive voltage terminal (+) of the operational amplifier 54. Here, the third feedback voltage is a voltage of the sixth node ND6, and may be generated due to voltage division between the fifth resistor R5 and the sixth resistor R6. The twelfth switch SW12 may be connected between the seventh node ND7 and the ground terminal GND.

Each of the first feedback network circuit 51, the second feedback network circuit 52, and the third feedback network circuit 53 may independently configure the feedback network in response to the corresponding feedback signals $Q_{F1}$, $Q_{F2}$, and $Q_{F3}$. In an example embodiment, the first feedback network circuit 51 may configure the feedback network by turning on the first switch SW1 and the third switch SW3 in response to the first feedback signal $Q_{F1}$. In an example embodiment, the second feedback network circuit 52 may configure the feedback network by turning on the fifth switch SW5 and the seventh switch SW7 in response to the second feedback signal $Q_{F2}$. In an example embodiment, the third feedback network circuit 53 may configure the feedback network by turning on the ninth switch SW9 and the eleventh switch SW11 in response to the third feedback signal $Q_{F3}$.

In an example embodiment, each of the switches SW1 to SW12 may be implemented as a transmission gate.

The operational amplifier 54 (OP-AMP) may be implemented to compare a reference voltage VREF and the feedback voltage. Here, the reference voltage VREF may be provided to a negative voltage terminal (−) of the operational amplifier 54. In an example embodiment, the reference voltage VREF may be changed according to the feedback voltage of the corresponding feedback network circuit. The reference voltage VREF may be provided from an internal reference voltage generator.

Figure 6:
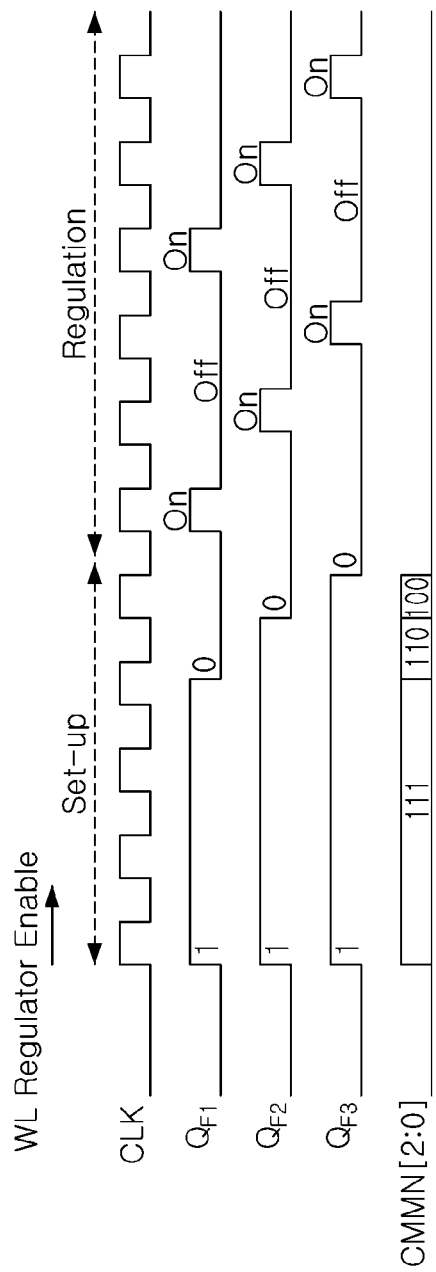
FIG. 6 is a diagram illustrating, by way of example, an operation timing of the zone voltage generator according to the example embodiment of the present disclosure.

FIG. 6 is a diagram illustrating, by way of example, an operation timing of the zone voltage generator according to the example embodiment of the present disclosure.

The zone voltage generator 50 according to an example embodiment of the present disclosure may include independently configured feedback networks. Each feedback network may be controlled by two time phases. Here, the time phase may be divided into a set-up time phase and a regulation phase time phase. The set-up time phase refers to a period of time from immediately after an enable signal of a wordline regulator is applied. The regulation time phase refers to the time after the set-up time phase until the regulation signal becomes low.

During the set-up time, each transistor and the feedback resistor may be controlled independently from a main clock CLK through a multi-bit ([2:0]) common signal CMMN. As illustrated in FIG. 6, in response to the common signal CMMN of "111", the first feedback signal $Q_{F1}$, the second feedback signal $Q_{F2}$, and the third feedback signal $Q_{F3}$ all become a high level. In response to the common signal CMMN of "110", the first feedback signal $Q_{F1}$ becomes a low level, and the second feedback signal $Q_{F2}$ and the third feedback signal $Q_{F3}$ all become a high level. In response to the common signal CMMN of "100", the first feedback signal $Q_{F1}$ and the second feedback signal $Q_{F2}$ become a low level, and the third feedback signal $Q_{F3}$ all become a high level.

During the regulator time, each transistor and feedback resistor may be controlled by a clock divided into three with respect to the main clock (CLK). In this case, the output voltage may be regulated during the on-phase of the clock divided into three.

During the off-phase, the level of the output voltage may be maintained by floating the transistor and the feedback resistor.

Figure 7A:
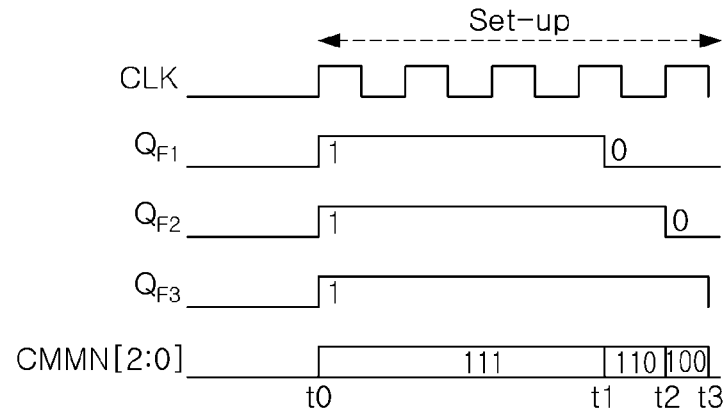
FIG. 7A is a diagram illustrating, by way of example, timing of a set-up period of the zone voltage generator according to the example embodiment of the present disclosure.
Figure 7B:
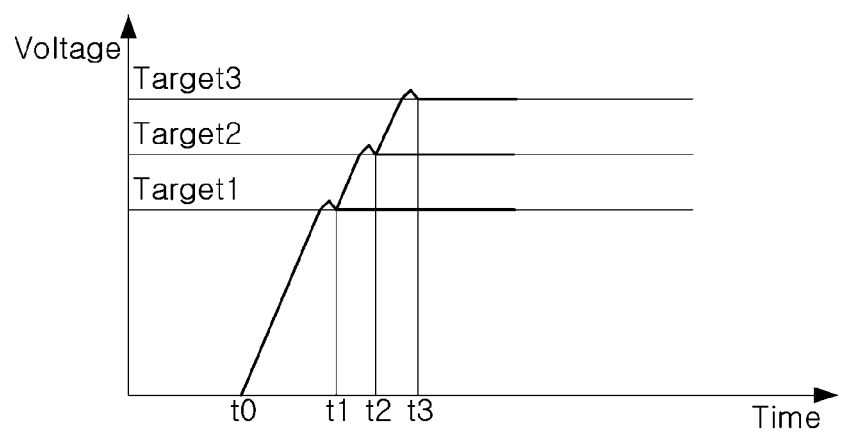
FIG. 7B is a diagram illustrating, by way of example, a voltage waveform according to the timing of the set-up period illustrated in FIG. 7A.

FIG. 7A is a diagram illustrating, by way of example, timing of a set-up period of the zone voltage generator according to the example embodiment of the present disclosure, and FIG. 7B is a diagram illustrating, by way of example, a voltage waveform according to the timing of the set-up period illustrated in FIG. 7A.

As illustrated in FIG. 7A, a common signal in a period before t0 is "000". The period is a voltage generation standby period. In a first period t0 to t1, the common signal is "111". The first period is a set-up period of the first feedback network circuit 51 (refer to FIG. 5). In a second period t1 to t2, the common signal is "110". The first period to the second period t0 to t2 is a set-up period of the second feedback network circuit 52 (refer to FIG. 5). In a third period t2 to t3, the common signal is "100". The first period to the third period t0 to t3 is a set-up period of the third feedback network circuit 53 (refer to FIG. 5).

FIGS. 8A to 8D are diagrams illustrating, by way of example, circuit operations according to the set-up periods of the zone voltage generator according to the example embodiment of the present disclosure.

Figure 8A:
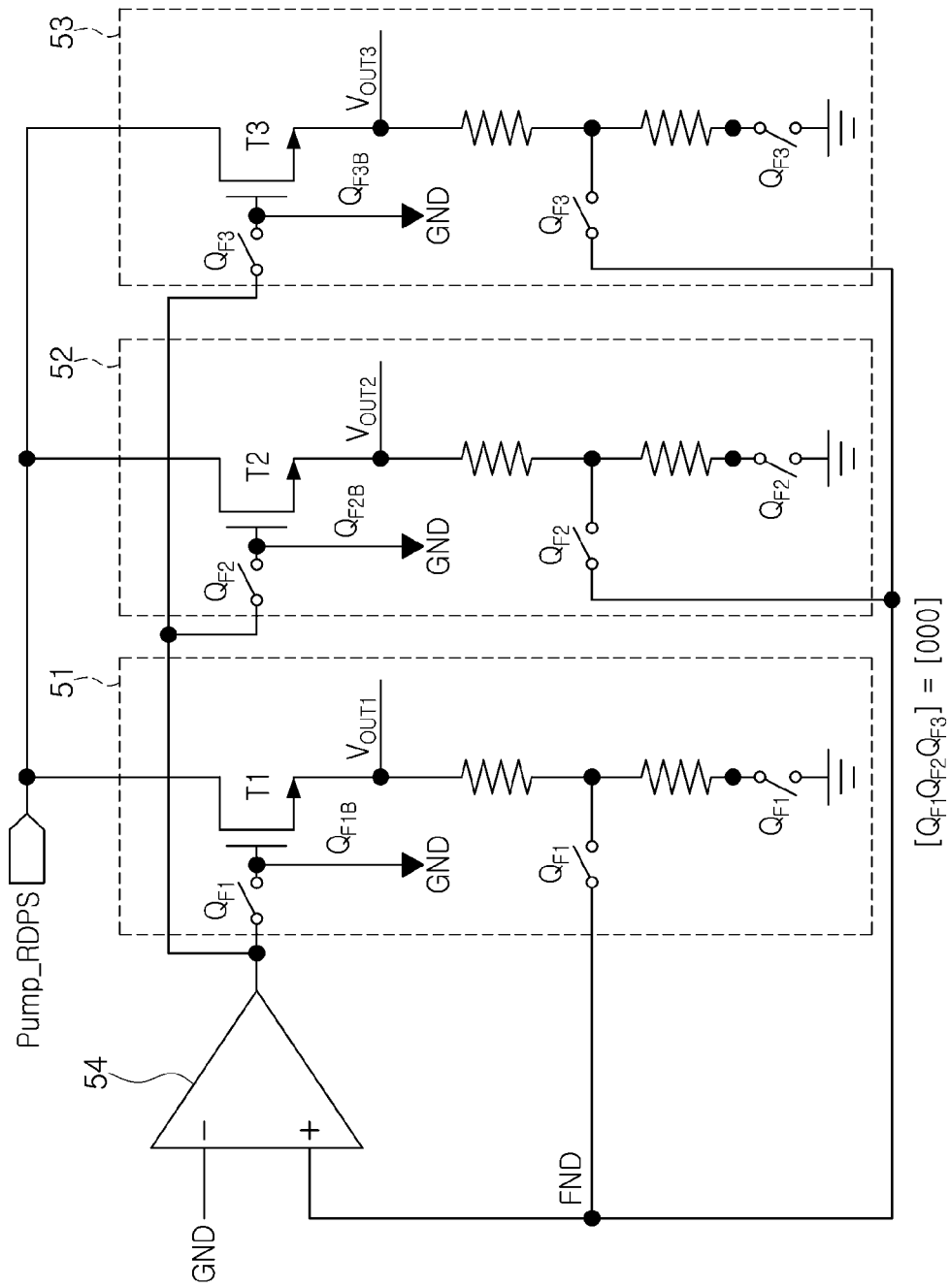
FIGS. 8A to 8D are diagrams illustrating, by way of example, circuit operations according to the set-up periods of the zone voltage generator according to the example embodiment of the present disclosure.

Referring to FIG. 8A, a feedback switch signal set $[Q_{F1}Q_{F2}Q_{F3}]=[000]$ in the period before to. The ground voltage (GND) is input to the negative voltage terminal (−) of the operational amplifier, and the feedback switches are all in an open state. In response to inverted signals $Q_{F1B}$, $Q_{F2B}$, and $Q_{F3B}$ of the feedback switch signals $Q_{F1}$, $Q_{F2}$, and $Q_{F3}$, gates of the respective transistors T1, T2, and T3 may be connected to the ground terminal GND.

Figure 8B:
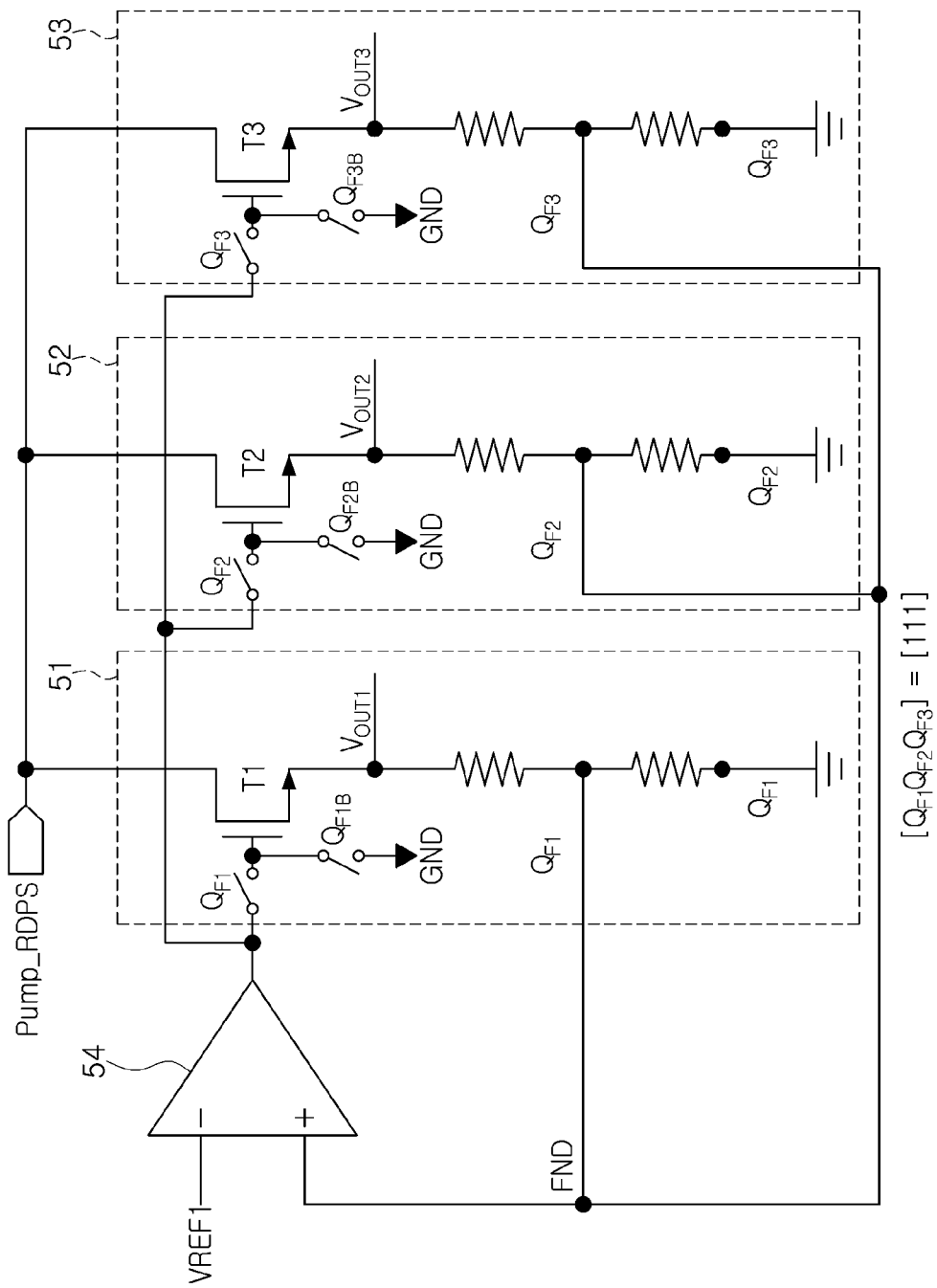

Referring to FIG. 8B, in the first period t0 to t1, the feedback switch signal set $[Q_{F1}Q_{F2}Q_{F3}]=[111]$. Each feedback network circuit may perform normal operation. A first reference voltage VREF1 may be applied to the negative voltage terminal (−) of the operational amplifier.

Figure 8C:
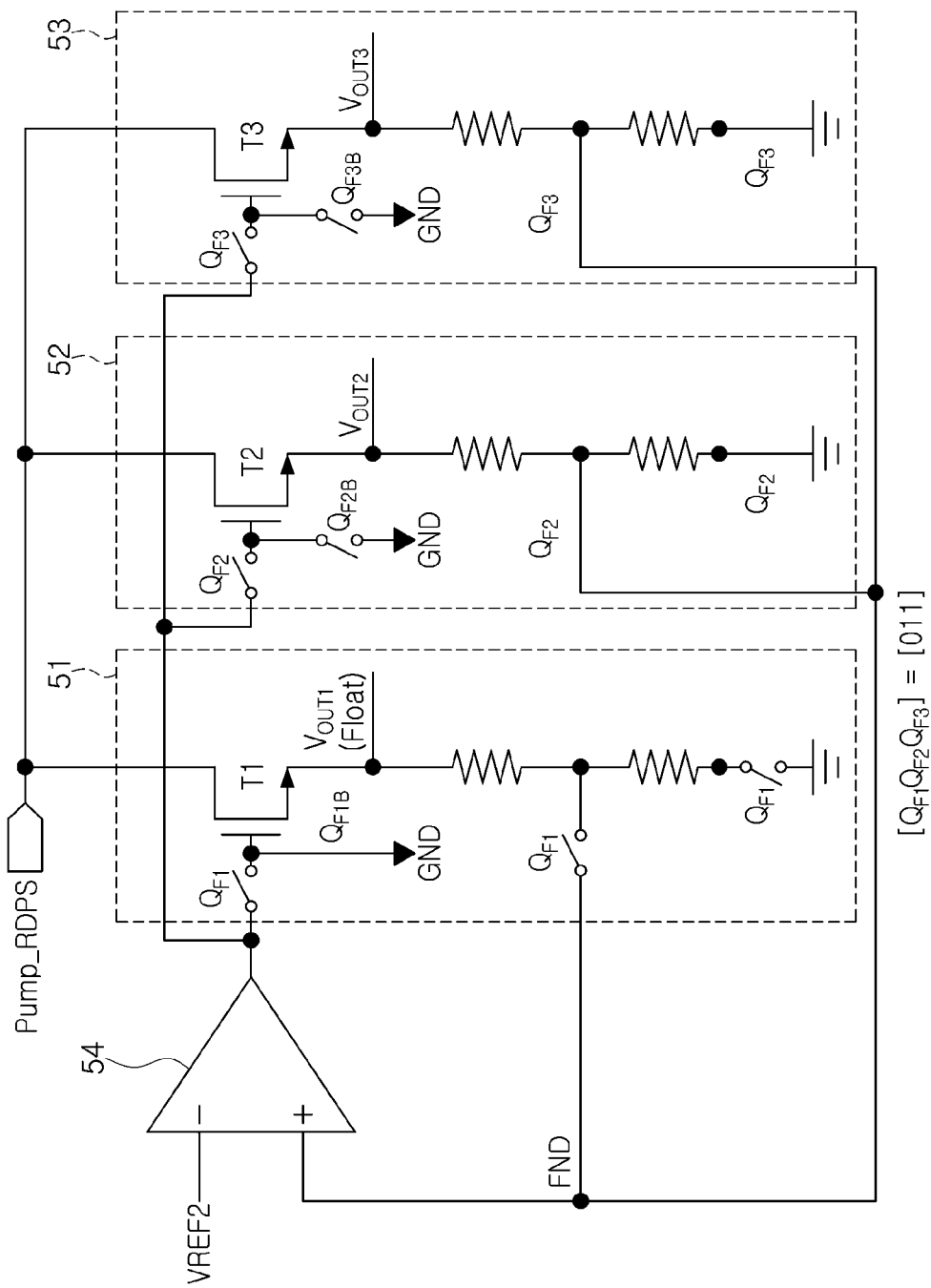

Referring to FIG. 8C, in the second period t1 to t2, the feedback switch signal set $[Q_{F1}Q_{F2}Q_{F3}]=[011]$. The first feedback network circuit 51 may be in an open state in the feedback network, and the second and third feedback network circuits 52 and 53 may perform normal operation. A second reference voltage VREF2 may be applied to the negative voltage terminal (−) of the operational amplifier. Here, the second reference voltage VREF2 may be higher than the first reference voltage VREF1.

Figure 8D:
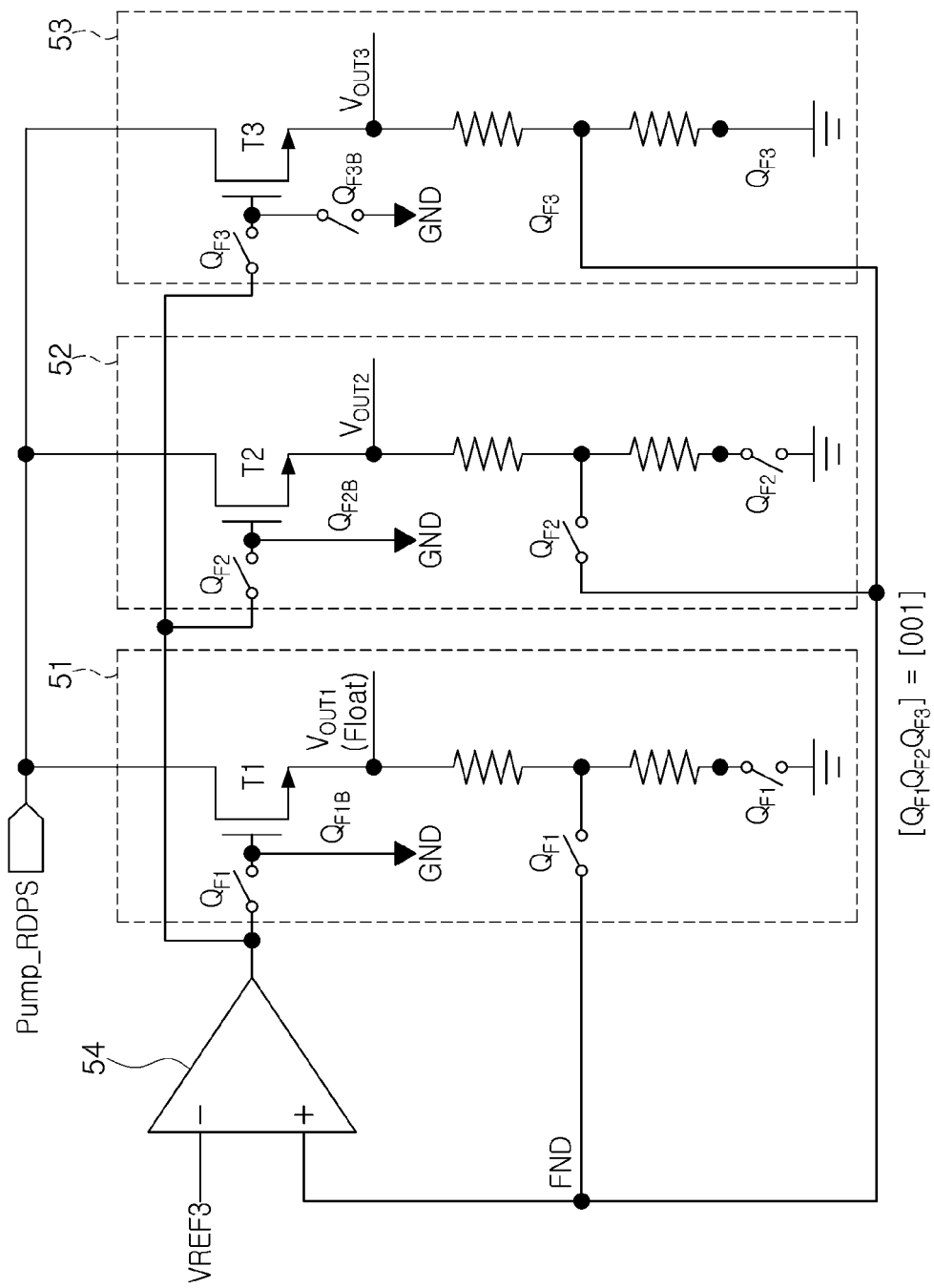

Referring to FIG. 8D, in the third period t2 to t3, the feedback switch signal set $[Q_{F1}Q_{F2}Q_{F3}]=[001]$. The first feedback network circuit 51 and the second feedback network circuit 52 may be in an open state in the feedback network, and the third feedback network circuit 53 may perform normal operation. A third reference voltage VREF3 may be applied to the negative voltage terminal (−) of the operational amplifier. Here, the third reference voltage VREF3 may be higher than the second reference voltage VREF2.

Meanwhile, values of the timestamps t1, t2, and t3 may be defined as a variable time flag signal. The set-up time may be set to correspond to regulator loading fluctuations.

On the other hand, the value of the common signal CMMN may be defined to be changed for each timestamp t1, t2, and t3 according to the order of absolute values of the output voltages Vout1, Vout2, Vout3 connected to the multi-bit common signal CMMN.

Figure 9A:
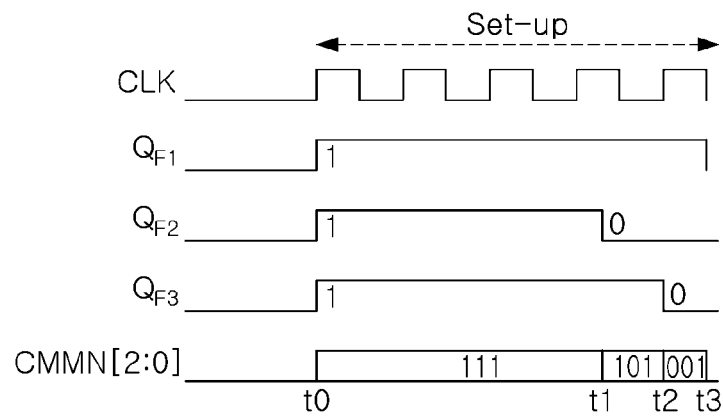
FIGS. 9A and 9B are diagrams illustrating, by way of example, a change in a common signal and a change in a waveform according to the change.
Figure 9B:
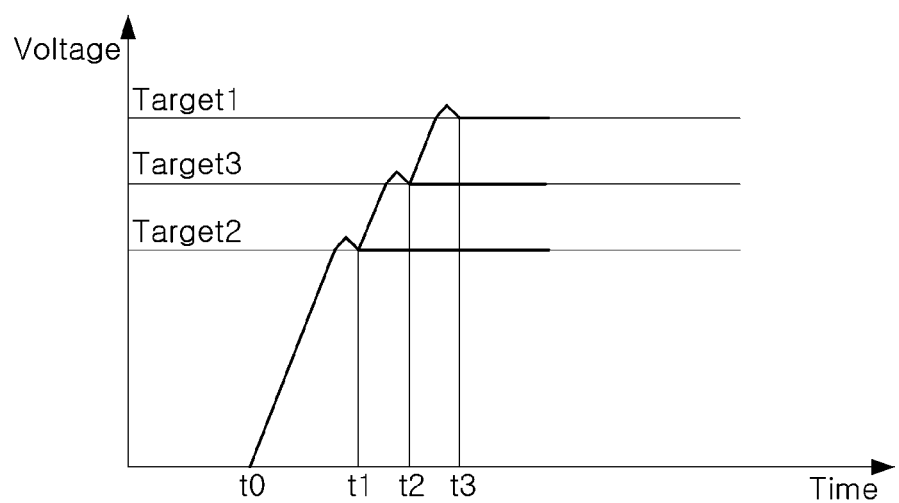

FIGS. 9A and 9B are diagrams illustrating, by way of example, a change in a common signal and a change in a waveform according to the change.

Referring to FIG. 9A, the value of the common signal CMMN may be set differently from that of FIG. 7B according to the order of absolute values of the output voltages Vout1, Vout2, and Vout3. For example, when the second output voltage Vout2 is the lowest, the third output voltage Vout3 is the next lowest, and the first output voltage Vout1 is the highest, the common signal CMMN may be set to "111" in the first period t0 to t1, set to "101" in the second period t1 to t2, and set to "001" in the third period t2 to t3. Accordingly, as illustrated in FIG. 9B, looking at the output waveform, a second target level may be set up first, then a third target level may be set up, and finally a first target level may be set up. Here, the first target level may correspond to the first output voltage Vout1, the second target level may correspond to the second output voltage Vout2, and the third target level may correspond to the third output voltage Vout3.

Figure 10A:
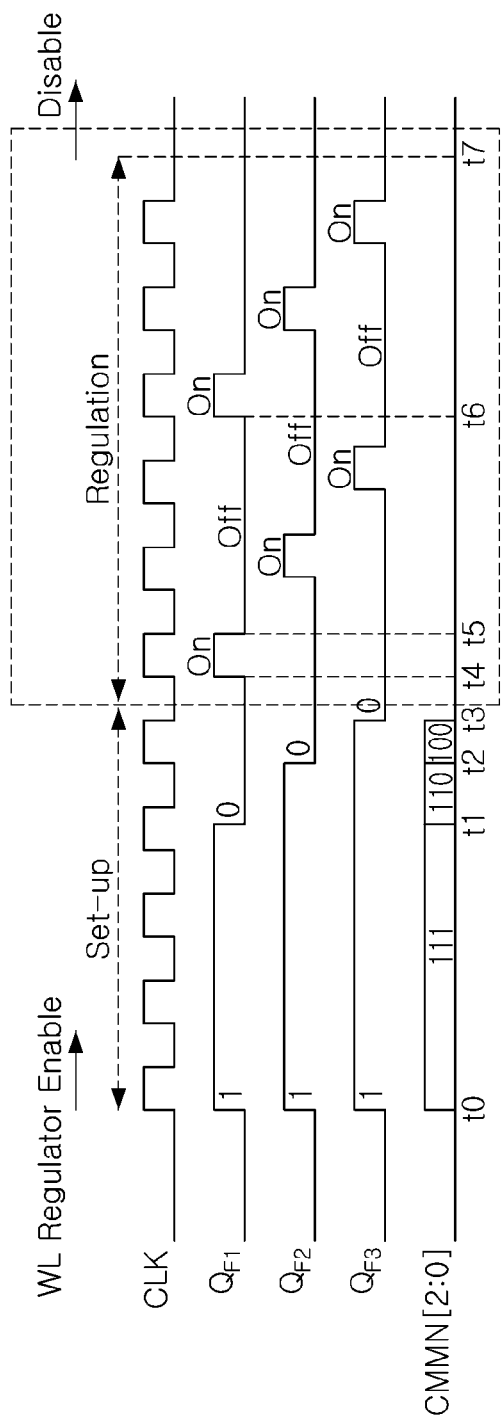
FIGS. 10A and 10B are diagrams illustrating, by way of example, timing according to a regulation period of the zone voltage generator and a waveform corresponding thereto according to an example embodiment of the present disclosure.
Figure 10B:
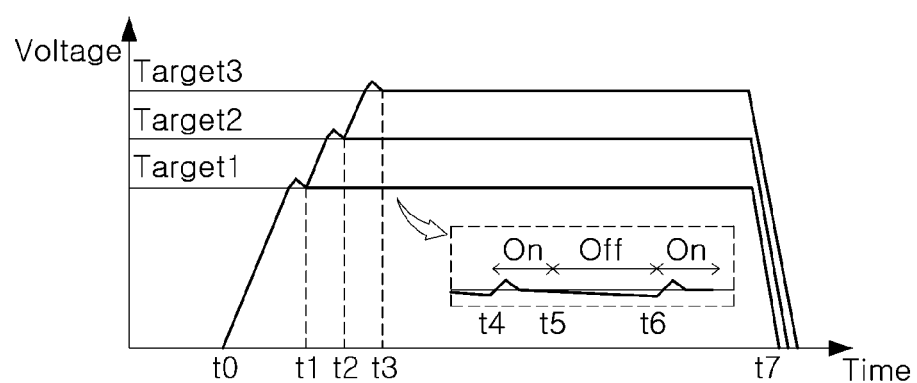

FIGS. 10A and 10B are diagrams illustrating, by way of example, timing according to a regulation period of the zone voltage generator and a waveform corresponding thereto according to an example embodiment of the present disclosure.

FIG. 10A illustrates a timing diagram of the entire operation period including the regulation period. In a fourth period t3 to t4, a regulation operation for the first target level of the first feedback network circuit 51 (refer to FIG. 5) may be performed in response to the first feedback signal $Q_{F1}$. Here, the first target level may correspond to the first output voltage Vout1. In a fifth period t4 to t5, a regulation operation for the second target level of the second feedback network circuit 52 (refer to FIG. 5) may be performed in response to the second feedback signal $Q_{F2}$. Here, the second target level may correspond to the second output voltage Vout2. In a sixth period t5 to t6, a regulation operation for the third target level of the third feedback network circuit 53 (refer to FIG. 5) may be performed in response to the third feedback signal $Q_{F3}$. Here, the third target level may correspond to the third output voltage Vout3. After the regulation period described above, the wordline regulator may be disabled.

Referring to FIG. 10B, offsets relative to each target level may occur during off-phase due to leakage of wordlines connected to each of the output voltages Vout1, Vout2, and Vout3 in the regulation period or a coupling phenomenon with an external signal. The voltage regulation may be performed to an intended target level during an on-phase period.

FIGS. 11A to 11D are diagrams illustrating, by way of example, an operation for each phase of the regulation period of the zone voltage generator according to the example embodiment of the present disclosure.

Figure 11A:
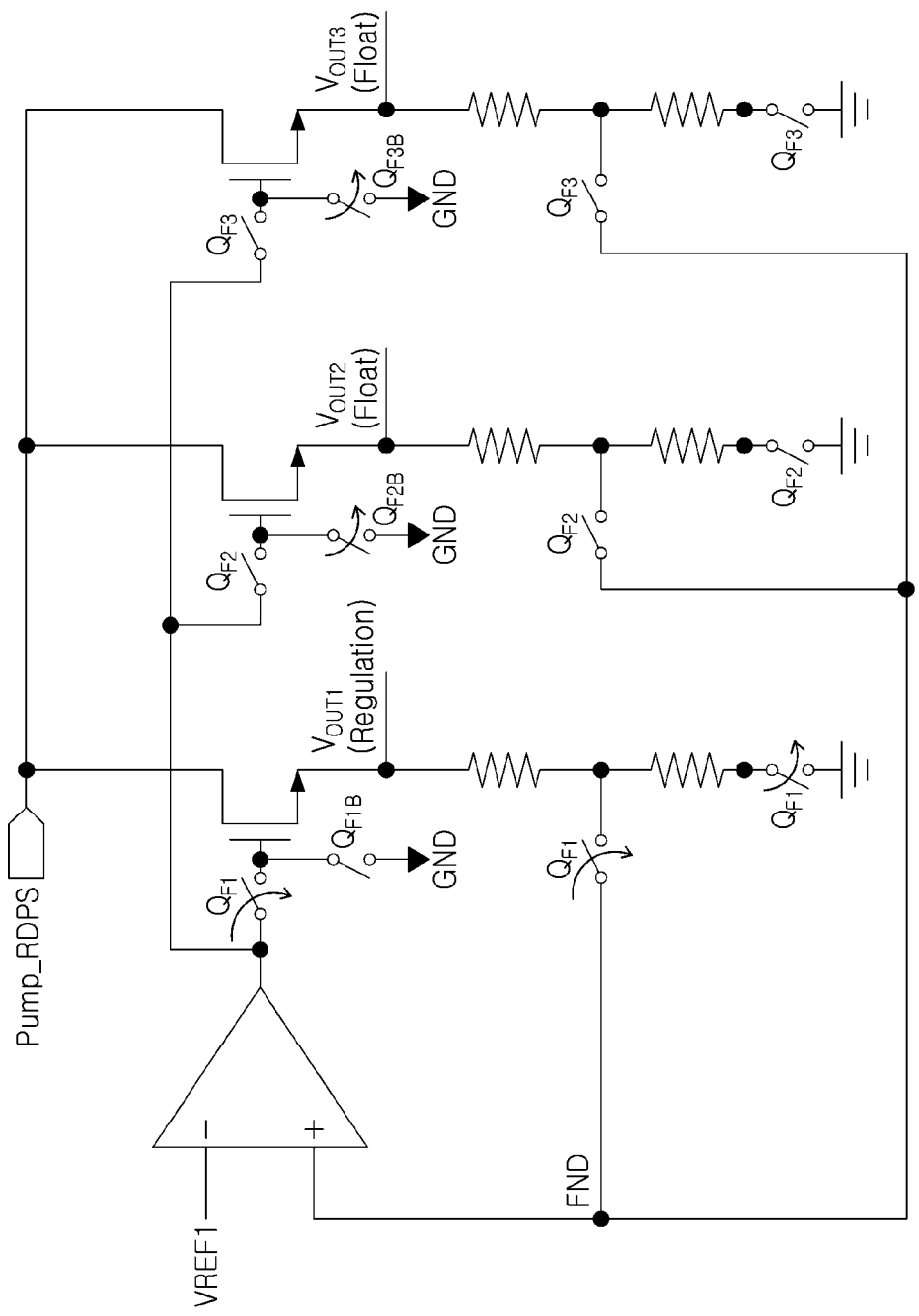
FIGS. 11A to 11D are diagrams illustrating, by way of example, an operation for each phase of the regulation period of the zone voltage generator according to the example embodiment of the present disclosure.
Figure 11B:
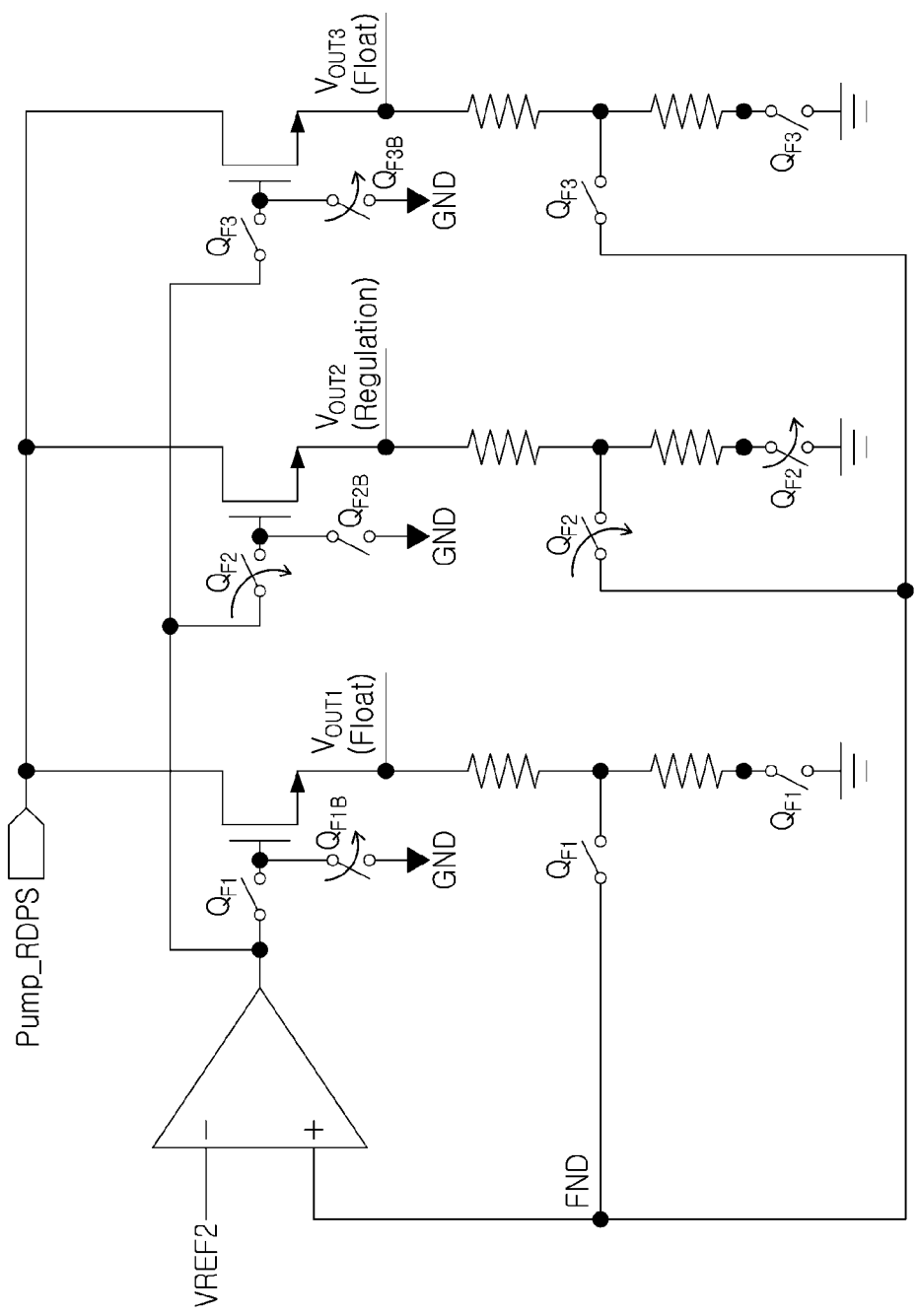
Figure 11C:
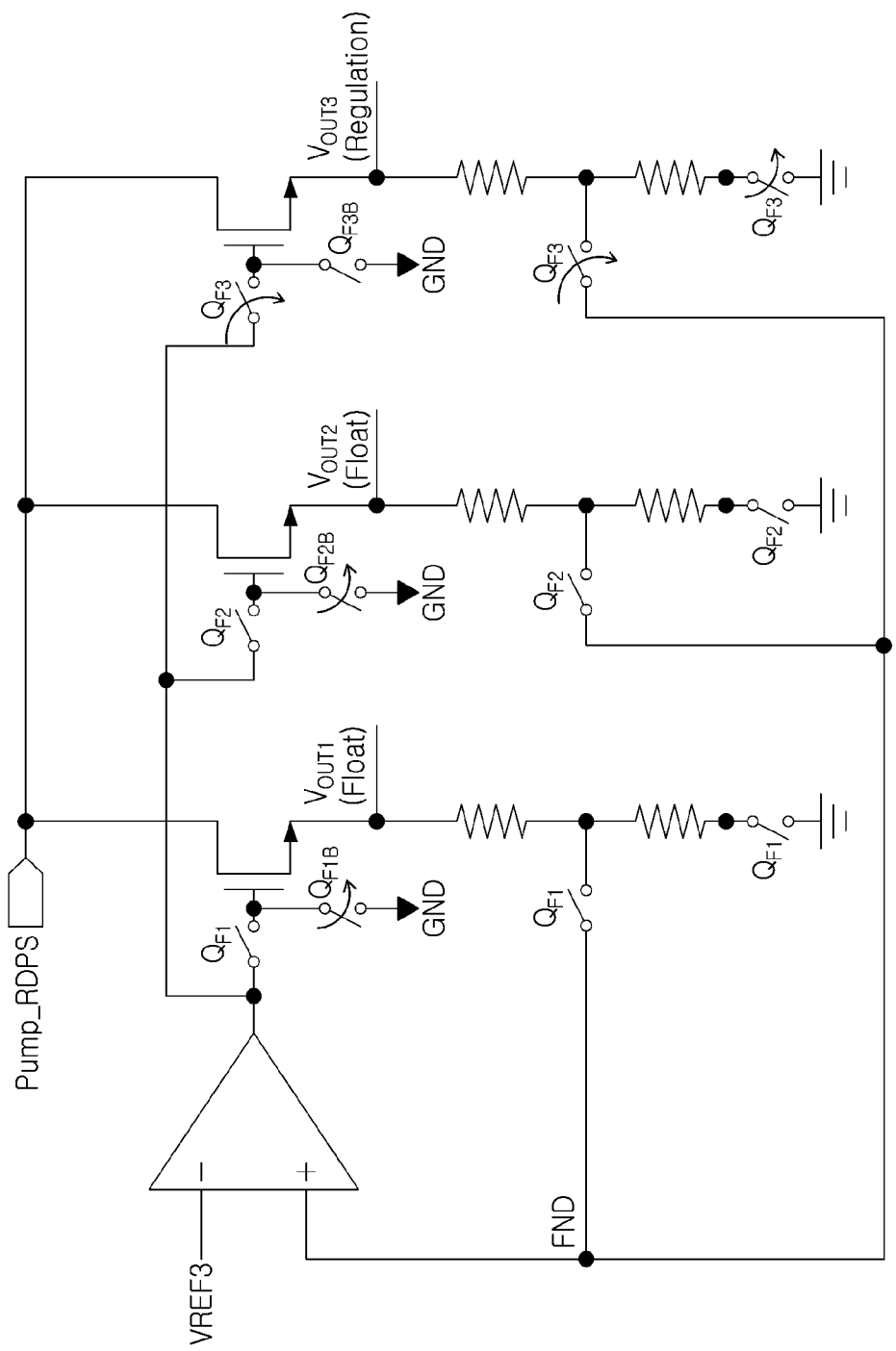
Figure 11D:
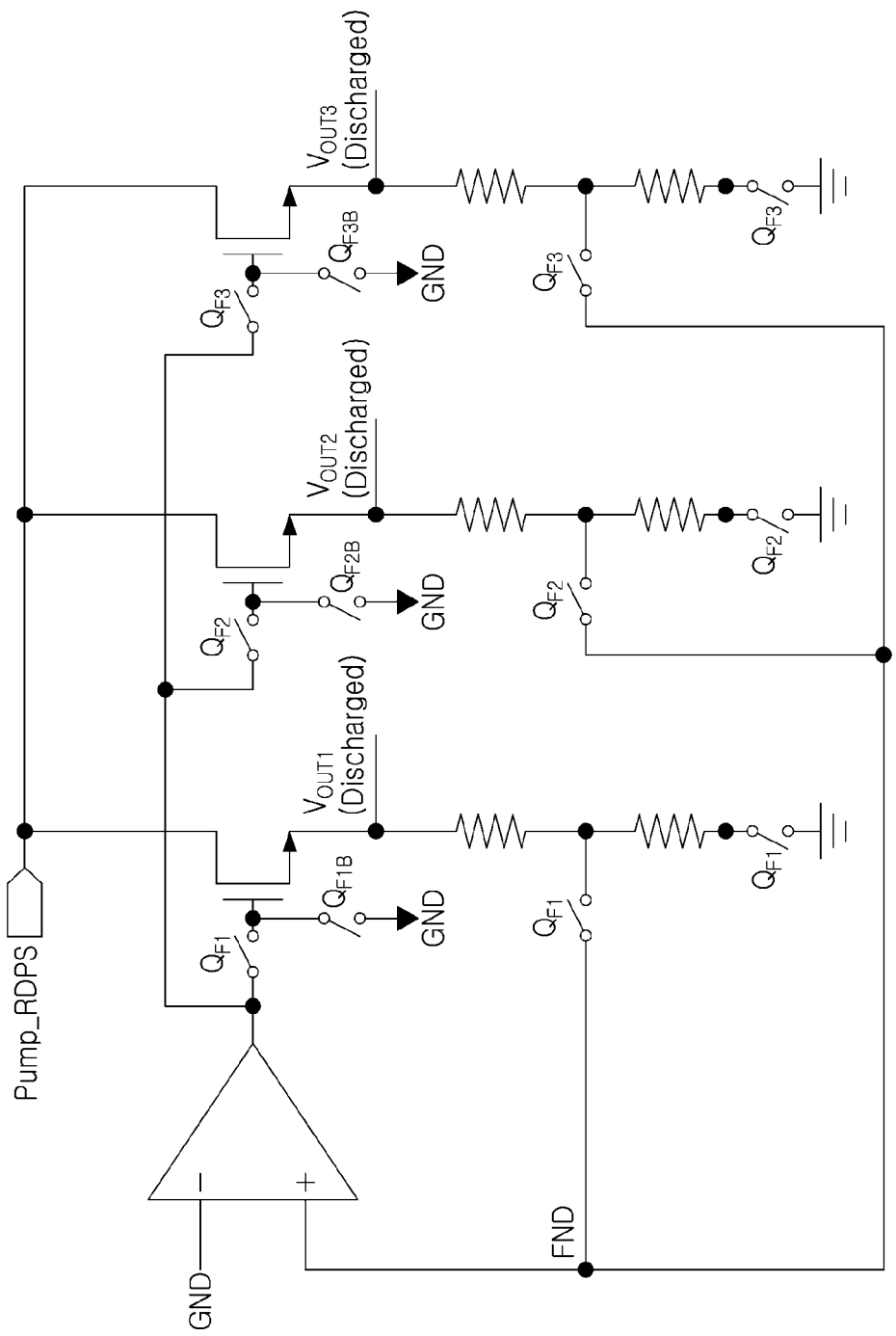

Referring to FIG. 11A, an on-phase state for the regulation of the first feedback network circuit 51 is illustrated. Referring to FIG. 11B, an on-phase state for the regulation of the second feedback network circuit 52 is illustrated. Referring to FIG. 11C, an on-phase state for the regulation of the third feedback network circuit 53 is illustrated. Referring to FIG. 11D, disable states of the regulators of all the feedback network circuits 51, 52, and 53 are illustrated. When the disable signal of the wordline regulator is received, all the switches of the regulator feedback network may operate in the same manner as the off-phase. The output voltage may be discharged to an internal power voltage VCC or a ground voltage GND through a discharge device inside (or outside) the corresponding regulator block.

Meanwhile, in the set-up period illustrated in FIG. 6, the feedback signals are divided into a period having a common phase and a period not having the common phase. However, the set-up period of the present disclosure will not be limited thereto. The set-up period of the present disclosure may be implemented only with periods having the common phase.

Figure 12A:
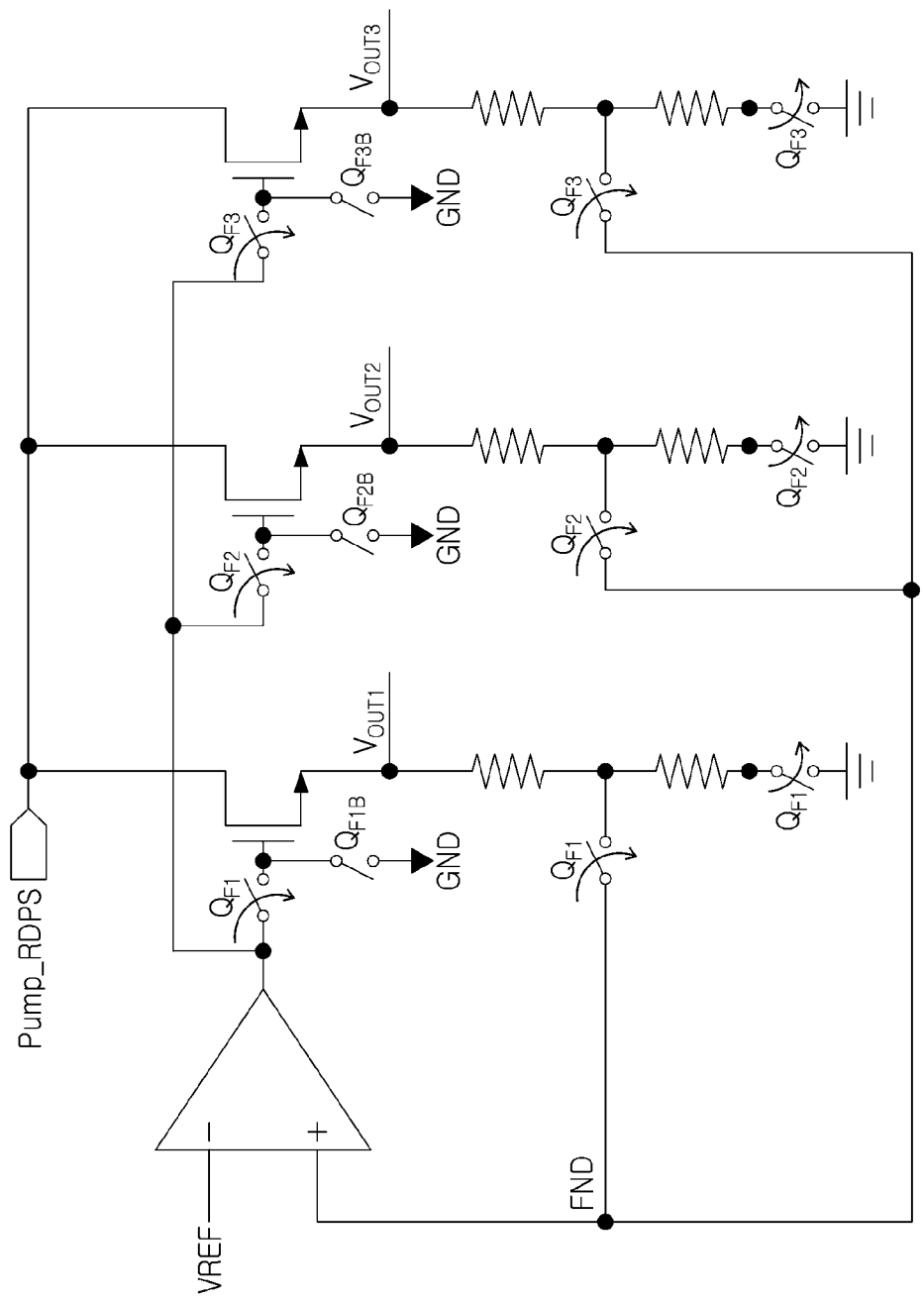
FIGS. 12A and 12B are diagrams illustrating, by way of example, an operation of a zone voltage generator according to a common phase and timing corresponding thereto according to an example embodiment of the present disclosure.
Figure 12B:
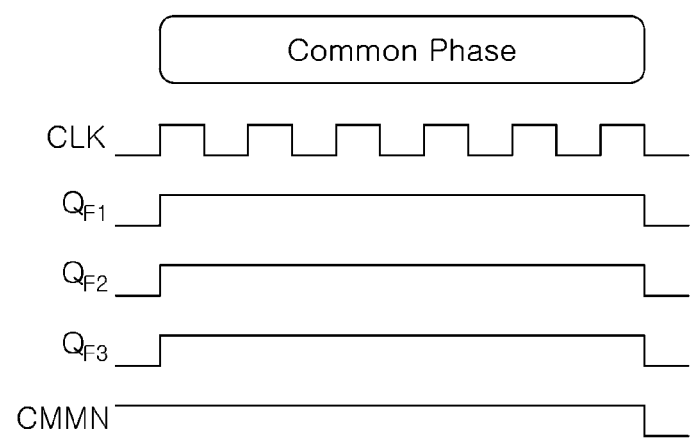

FIGS. 12A and 12B are diagrams illustrating, by way of example, an operation of a zone voltage generator according to a common phase and timing corresponding thereto according to an example embodiment of the present disclosure. Immediately after the wordline set-up start time, the feedback signals $Q_{F1}$, $Q_{F2}$, and $Q_{F3}$ may be set to a common phase for a predetermined time. Accordingly, wordlines belonging to each wordline area may be set-up at the same time.

Thereafter, the zone voltage generator according to an example embodiment of the present disclosure may perform a regulation operation according to a divided phase.

Figure 13A:
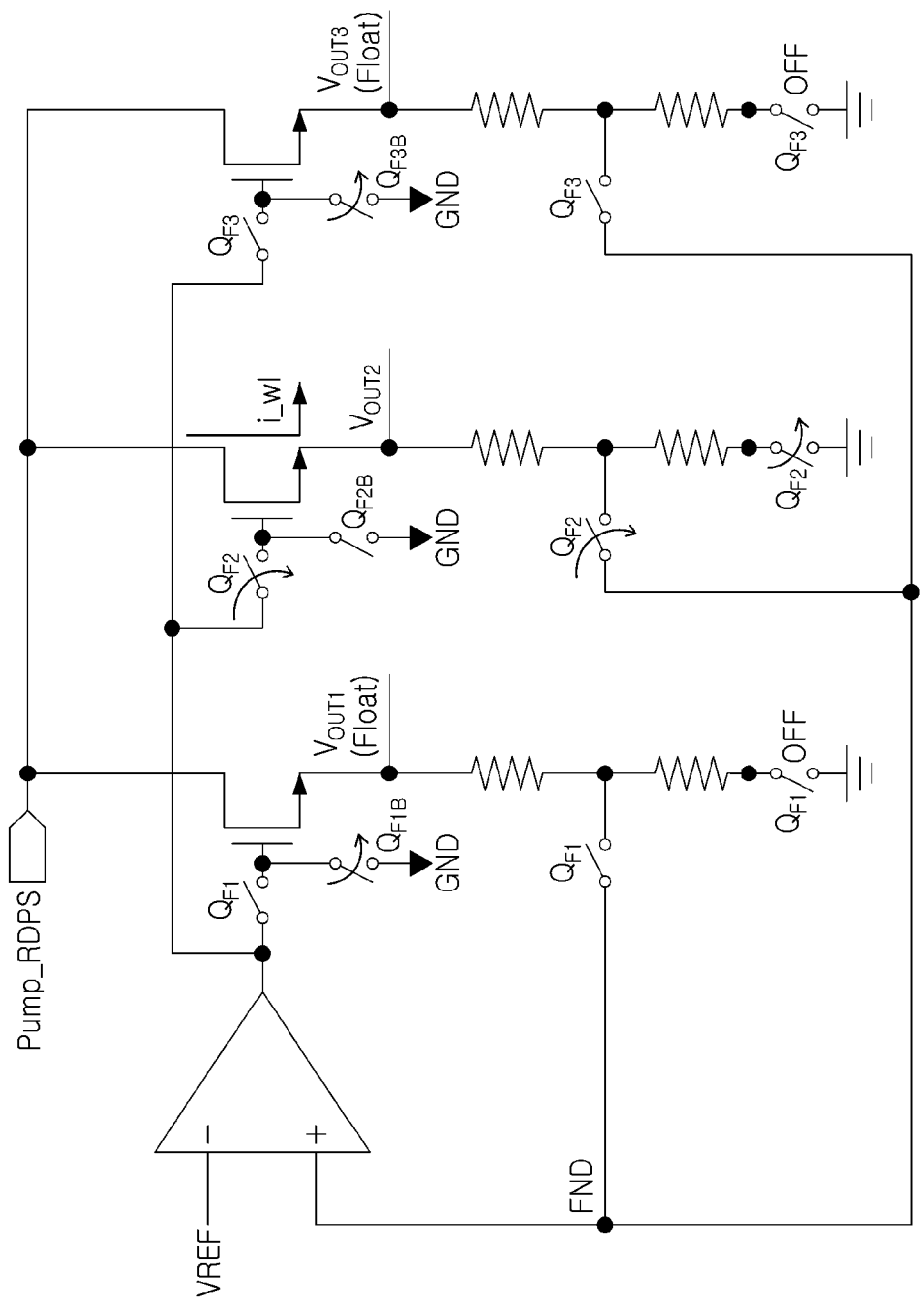
FIGS. 13A and 13B are diagrams illustrating, by way of example, an operation of a zone voltage generator according to a divided phase and timing corresponding thereto according to an example embodiment of the present disclosure.
Figure 13B:
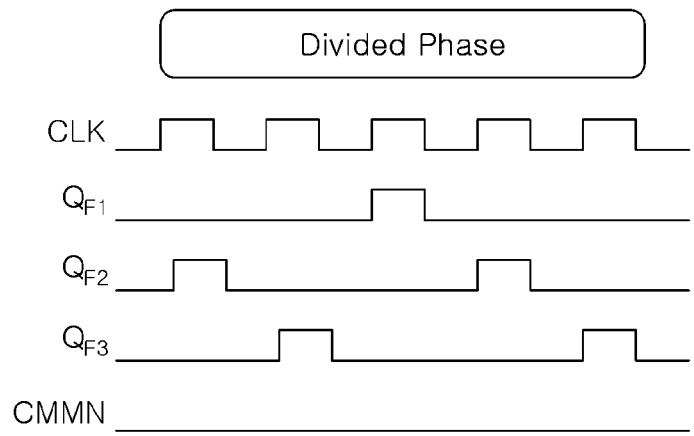

FIGS. 13A and 13B are diagrams illustrating, by way of example, an operation of a zone voltage generator according to a divided phase and timing corresponding thereto according to an example embodiment of the present disclosure. After the common phase, the feedback signals $Q_{F1}$, $Q_{F2}$, and $Q_{F3}$ sequentially repeat a feedback path connection, and thus, the corresponding regulation level may be maintained. Referring to FIG. 13A, the second feedback network circuit 52 forms the feedback network to maintain the second target level. In this case, a wordline current i_wl may be provided to the corresponding wordlines through the output terminal. The remaining first and third feedback network circuits 51 and 53 are not connected to the feedback network and are in a floating state.

Figure 14A:
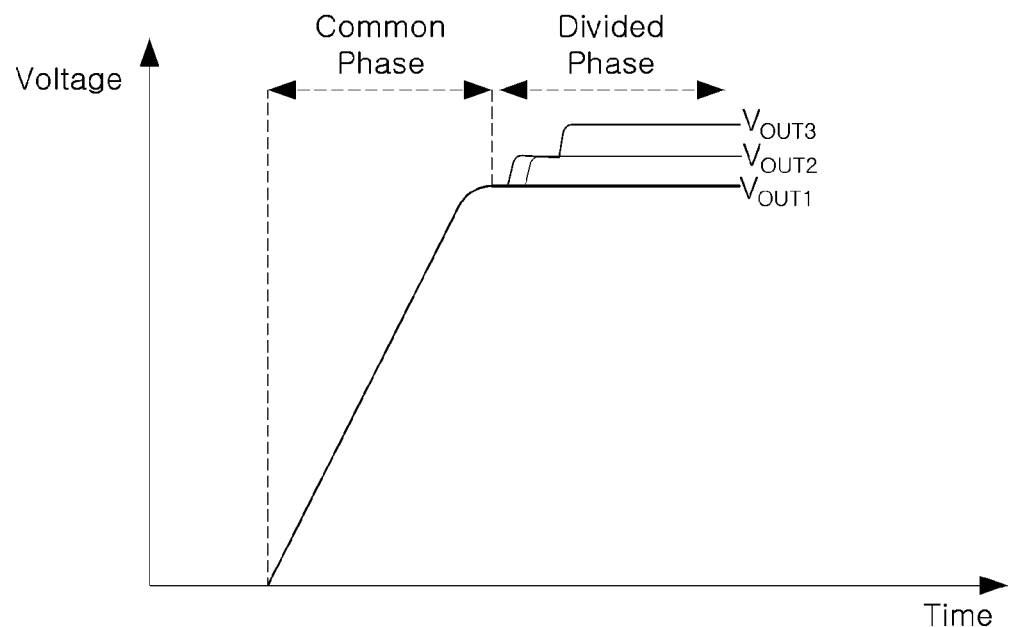
FIGS. 14A and 14B are diagrams illustrating, by way of example, a voltage behavior and timing corresponding thereto according to the common phase and divided phase of the zone voltage generator according to the example embodiment of the present disclosure.
Figure 14B:
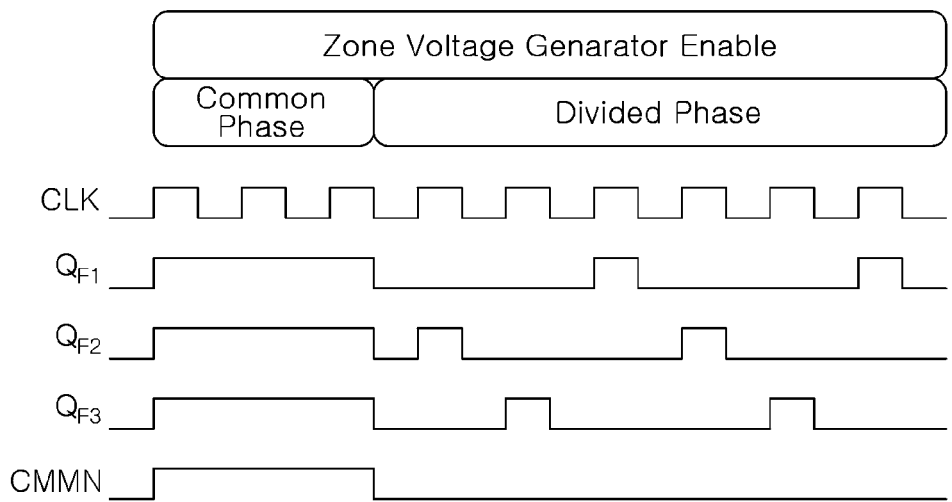

FIGS. 14A and 14B are diagrams illustrating, by way of example, a voltage behavior and timing corresponding thereto according to the common phase and divided phase of the zone voltage generator according to the example embodiment of the present disclosure. As illustrated in FIG. 14A, the first output voltage Vout1, the second output voltage Vout2, and the third output voltage Vout3 may be sequentially regulated.

As illustrated in FIG. 14B, the first output voltage Vout1, the second output voltage Vout2, and the third output voltage Vout3 may be set to the first target level according to the common phase of the feedback signals $Q_{F1}$, $Q_{F2}$, and $Q_{F3}$. Thereafter, each of the first output voltage Vout1, the second output voltage Vout2, and the third output voltage Vout3 according to the divided phase of the feedback signals $Q_{F1}$, $Q_{F2}$, and $Q_{F3}$ is repeatedly regulated to the corresponding target level.

Meanwhile, the zone voltage generator according to the example embodiment of the present disclosure may be implemented in an over-driving and discharging method.

Figure 15A:
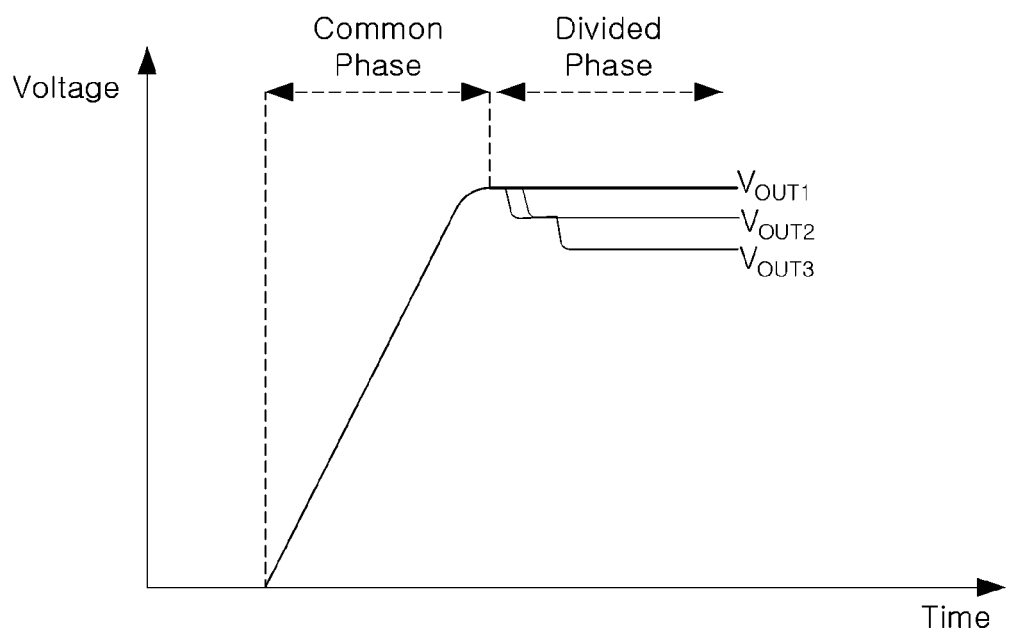
FIGS. 15A and 15B are diagrams illustrating, by way of example, a voltage behavior and timing corresponding thereto according to a common phase and a divided phase of a zone voltage generator according to another example embodiment of the present disclosure.
Figure 15B:
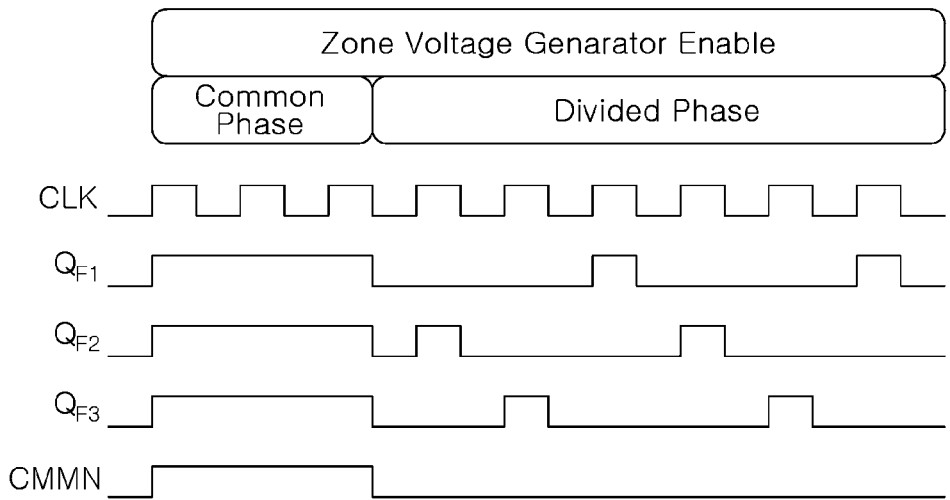

FIGS. 15A and 15B are diagrams illustrating, by way of example, a voltage behavior and timing corresponding thereto according to a common phase and a divided phase of a zone voltage generator according to another example embodiment of the present disclosure. As illustrated in FIG. 15A, immediately after a wordline set-up start time, wordlines belonging to each wordline area during a common phase may be set-up to the highest target level. As illustrated in FIG. 15B, by sequentially repeating the feedback path connection according to the divided phase after the common phase, the corresponding output voltage may be discharged, and thus, the regulation level may be maintained.

Figure 16:
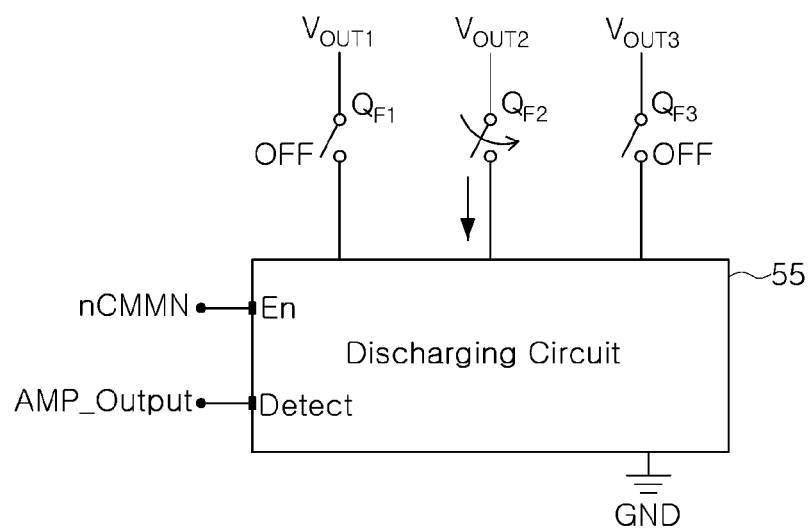
FIG. 16 is a diagram illustrating, by way of example, a discharging circuit for discharging a second output voltage according to the divided phase of the zone voltage generator according to the example embodiment of the present disclosure.

FIG. 16 is a diagram illustrating, by way of example, a discharging circuit 55 for discharging a second output voltage Vout2 according to the divided phase of the zone voltage generator according to the example embodiment of the present disclosure. Referring to FIG. 16, the discharging circuit 55 may set the corresponding target level by discharging the second output voltage Vout2 during the regulation operation of the second feedback network circuit. The discharging circuit 55 may be enabled in response to an inverted common signal nCommon and may be implemented to sense an amplifier output signal AMP_Output. That is, the discharging circuit 55 may include a terminal En receiving the inverted common signal nCommon and a detection terminal Detect receiving the amplifier output signal AMP_Output.

Figure 17:
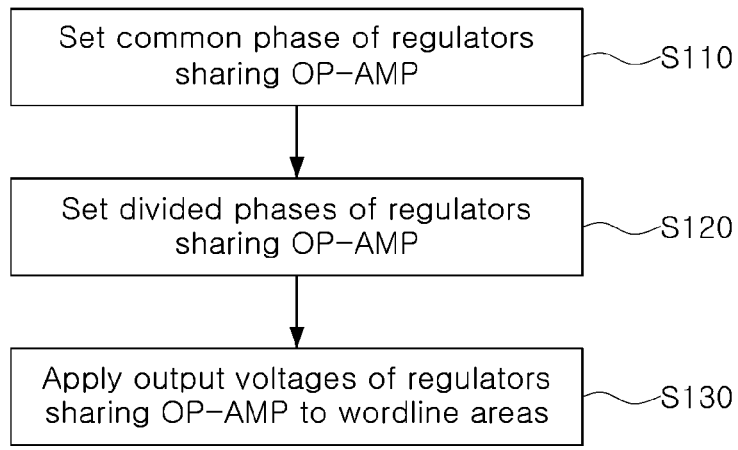
FIG. 17 is a flowchart illustrating, by way of example, a method of operating a nonvolatile memory device according to an example embodiment of the present disclosure.

FIG. 17 is a flowchart illustrating, by way of example, a method of operating a nonvolatile memory device according to an example embodiment of the present disclosure. Referring to FIG. 17, the operation of the nonvolatile memory device may proceed as follows.

The nonvolatile memory device 100 may set a common phase of regulators for wordline set-up (S110). Here, the output voltages corresponding to each of the regulators may be set to the target level according to the common phase.

The nonvolatile memory device 100 may set divided phases of regulators sharing an operational amplifier (OP-AMP) (S120). Here, each of the divided phases may perform a regulation operation of the corresponding regulator. According to such a regulation operation, each output voltage of the regulators may be set to the corresponding target level.

Thereafter, the nonvolatile memory device 100 may provide the output voltages of the regulators to the corresponding wordline areas (S130).

Figure 18:
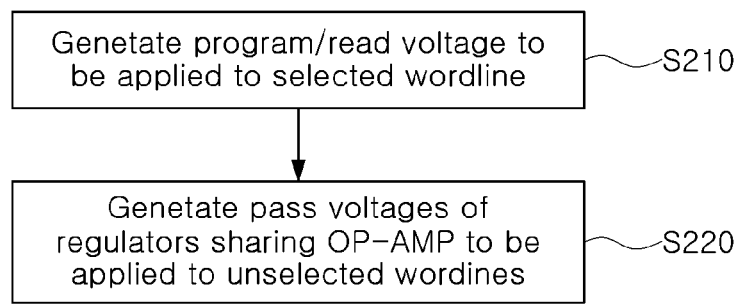
FIG. 18 is a flowchart illustrating, by way of example, a method of generating a voltage in a nonvolatile memory device according to an example embodiment of the present disclosure.

FIG. 18 is a flowchart illustrating, by way of example, a method of generating a voltage in a nonvolatile memory device according to an example embodiment of the present disclosure. Referring to FIG. 18, a method of generating a voltage in a nonvolatile memory device may proceed as follows.

A program/read voltage to be applied to the selected wordline may be generated (S210). Pass voltages may be applied to unselected wordlines and may be generated from regulators sharing the operational amplifier (S220). In an example embodiment, the corresponding pass voltage may be generated by dividing the input voltage in each of the regulators. In an example embodiment, the input voltage may be generated using an internal clock. In an example embodiment, the regulation operation may be performed by comparing the reference voltage and the respective feedback voltages of the regulators in the operational amplifier. In an example embodiment, a reference voltage corresponding to each of the regulators may be generated.

Meanwhile, the zone voltage generator according to an example embodiment of the present disclosure may include a plurality of regulators sharing one operational amplifier.

Figure 19A:
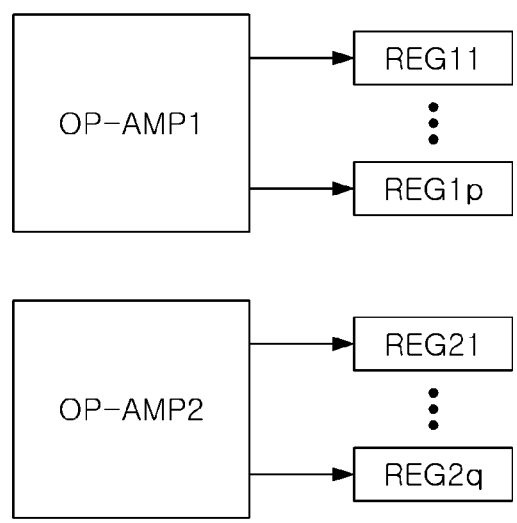
FIGS. 19A and 19B are diagrams illustrating, by way of example, a zone voltage generator according to another example embodiment of the present disclosure.
Figure 19B:
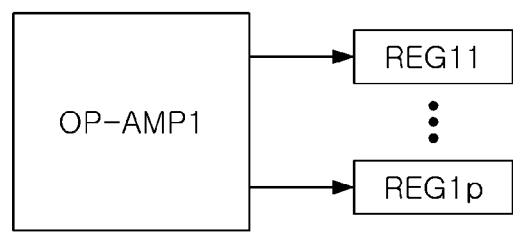
Figure 19B:
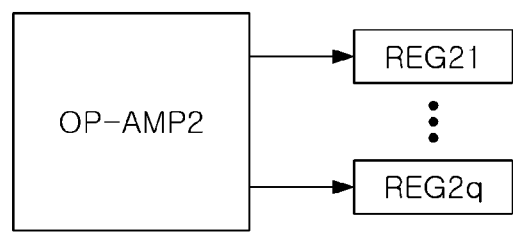
Figure 19B:
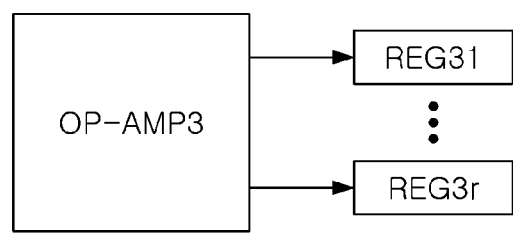

FIGS. 19A and 19B are diagrams illustrating, by way of example, a zone voltage generator according to another example embodiment of the present disclosure.

Referring to FIG. 19A, a zone voltage generator 91 may include first regulators REG11, . . . , REG1p (where p is an integer greater than or equal to 2) sharing a first amplifier OP-AMP1 and second regulators REG21, . . . , REG2q (where q is an integer greater than or equal to 2) sharing a second amplifier OP-AMP2. Referring to FIG. 19B, a zone voltage generator 92 may include the first regulators REG11, . . . , REG1p sharing the first amplifier OP-AMP1, the second regulators REG21, . . . , REG2q sharing the second amplifier OP-AMP2, and third regulators REG31, . . . , REG3r sharing a third amplifier OP-AMP3 (where r is an integer greater than or equal to 2).

Figure 20:
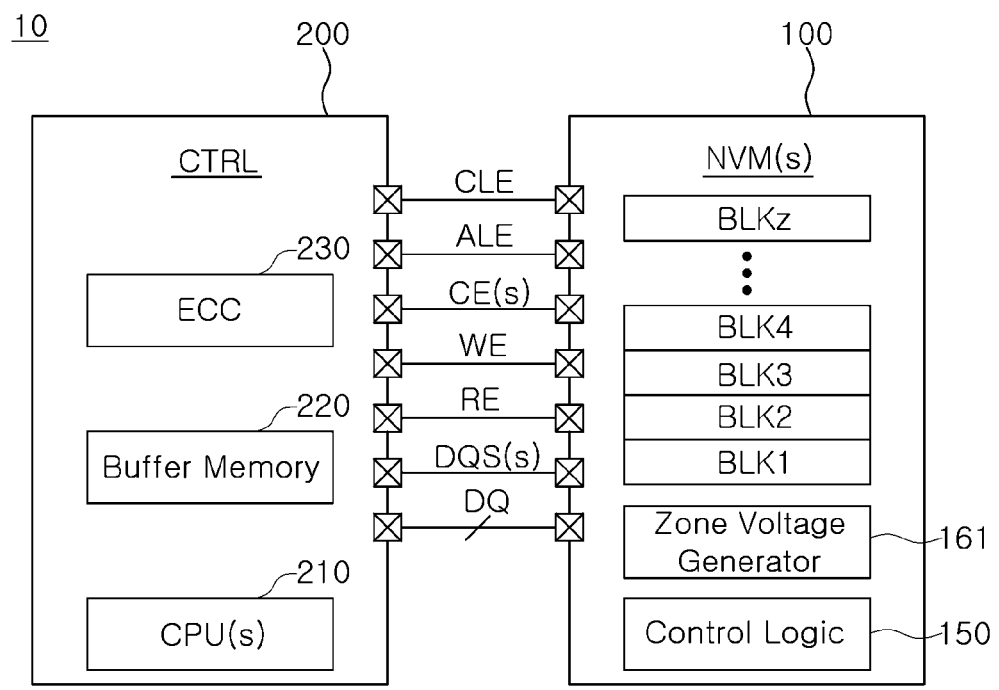
FIG. 20 is a diagram illustrating, by way of example, a storage device according to an example embodiment of the present disclosure.

FIG. 20 is a diagram illustrating, by way of example, a storage device 10 according to an example embodiment of the present disclosure. Referring to FIG. 20, the storage device 10 may include at least one nonvolatile memory device 100 and a controller 200 controlling the same.

A control logic 150 of the nonvolatile memory device 100 may be implemented to receive a command and an address from the controller (CTRL) 200 and perform operations (programming operation, read operation, erase operation, etc.) corresponding to the received command in the memory cells corresponding to the address.

The controller (CTRL) 200 may be connected to at least one nonvolatile memory device 100 through a plurality of control pins that transmit control signals (for example, command latch enable (CLE), address latch enable (ALE), CE(s), write enable (WE), read enable (RE), etc.). In addition, the controller (CTRL) 200 may be implemented to control the nonvolatile memory device 100 using the control signals (CLE, ALE, CE(s), WE, RE, etc.). For example, the nonvolatile memory device 100 may perform a programming operation/read operation/erase operation by latching a command CMD or an address ADD at an edge of a write enable (WE) signal according to a command latch enable (CLE) signal and an address latch enable (ALE) signal. For example, during the read operation, the chip enable signal CE is enabled, the CLE is enabled during a command transmission period, the ALE is enabled during an address transmission period, and the RE may be toggled in a period where data is transmitted through a data signal line DQ. A data strobe signal DQS may be toggled with a frequency corresponding to a data input/output speed. The read data may be sequentially transmitted in synchronization with the data strobe signal DQS.

Also, the controller 200 may be implemented to control the overall operation of the storage device 10. The controller 200 may perform various management operations such as cache/buffer management, firmware management, garbage collection management, wear leveling management, data redundancy management, read refresh/reclaim management, bad block management, multi-stream management, mapping of host data and nonvolatile memory management, quality of service (QoS) management, system resource allocation management, nonvolatile memory queue management, read level management, erase/program management, hot/cold data management, power loss protection management, dynamic thermal management, initialization management, and redundant array of inexpensive disk (RAID) management.

Also, the controller 200 may include a buffer memory 220 and an error correction circuit 230. The buffer memory 220 may be implemented as a volatile memory (for example, a static random access memory (SRAM), a dynamic RAM (DRAM), a synchronous RAM (SDRAM), etc.) or a nonvolatile memory (a flash memory, a phase-change RAM (PRAM), a magneto-resistive RAM (MRAM), a resistive RAM (ReRAM), a ferro-electric RAM (FRAM), etc.). The ECC circuit 230 may be implemented to generate an error correction code during a programming operation and recover data DATA using an error correction code during a read operation. That is, the ECC circuit 230 may generate an error correction code (ECC) for correcting a fail bit or an error bit of the data DATA received from the nonvolatile memory device 100. The ECC circuit 230 may form data DATA to which a parity bit is added by performing error correction encoding on data provided to the nonvolatile memory device 100. The parity bit may be stored in the nonvolatile memory device 100. In addition, the ECC circuit 230 may perform error correction decoding on the data DATA output from the nonvolatile memory device 100. The ECC circuit 230 may correct an error using parity. The ECC circuit 230 may correct an error using coded modulation such as a low density parity check (LDPC) code, a BCH code, a turbo code, a Reed-Solomon code, a convolution code, a recursive systematic code (RSC), trellis-coded modulation (TCM), and block coded modulation (BCM). Meanwhile, when the error correction is impossible in the error correction circuit 230, a read retry operation may be performed.

Figure 21:
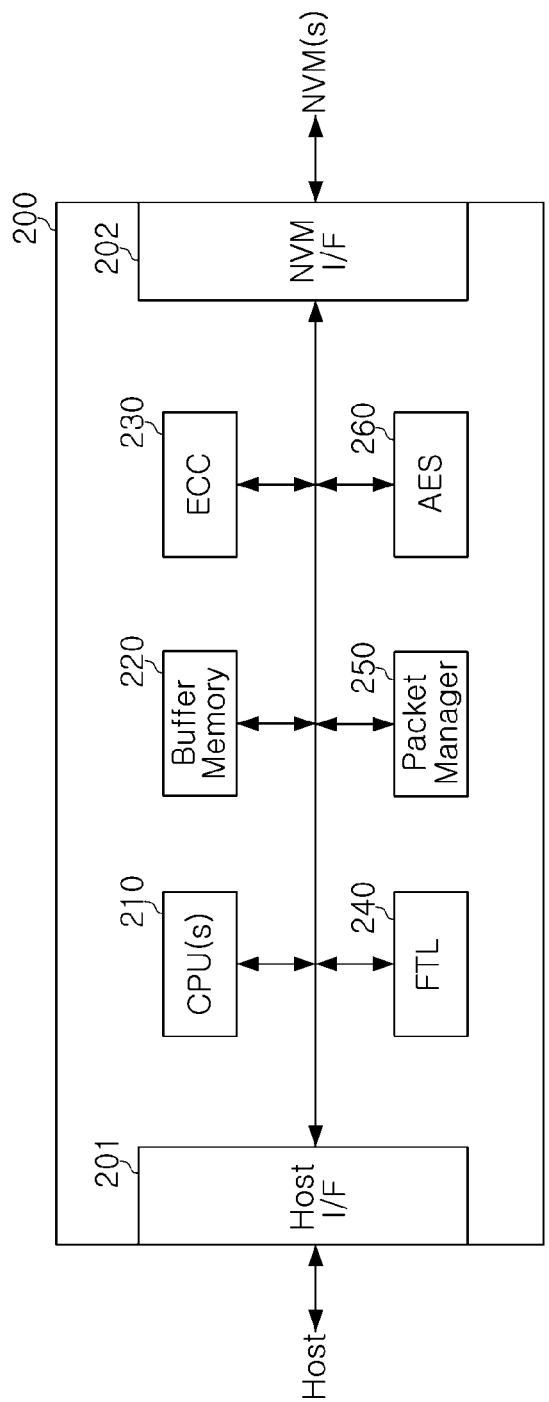
FIG. 21 is a diagram illustrating, by way of example, a controller according to an example embodiment of the present disclosure.

FIG. 21 is a diagram illustrating, by way of example, the controller 200 according to an example embodiment of the present disclosure. Referring to FIG. 21, the controller 200 includes a host interface circuit 201, a volatile memory interface circuit 202, at least one processor 210, a buffer memory 220, an error correction circuit 230, and a flash translation layer manager 240, a packet manager 250, and an advanced encryption device 260.

The host interface circuit 201 may be implemented to transmit and receive a packet to and from the host. The packet transmitted from the host to the host interface circuit 201 may include a command or data to be written to the nonvolatile memory device 100. The packet transmitted from the host interface circuit 201 to the host may include a response to a command or data read from the nonvolatile memory device 100.

The memory interface circuit 202 may transmit data to be written to the nonvolatile memory device 100 to the nonvolatile memory device 100 or receive data read from the nonvolatile memory device 100. The memory interface circuit 202 may be implemented to comply with a standard protocol such as JDEC Toggle or ONFI.

The flash translation layer manager 240 may perform various functions such as address mapping, wear-leveling, and garbage collection. The address mapping operation is an operation of changing a logical address received from the host into a physical address used to actually store data in the nonvolatile memory device 100. The wear-leveling is a technique for preventing excessive deterioration in a specific block by allowing blocks in the nonvolatile memory device 100 to be uniformly used, and may be implemented by, for example, a firmware technique for balancing erase counts of physical blocks. The garbage collection is a technique for securing usable capacity in the nonvolatile memory device 100 by copying valid data of a block to a new block and then erasing an existing block.

The packet manager 250 may generate a packet according to a protocol of an interface negotiated with the host or parse various information from the packet received from the host. Also, the buffer memory 216 may temporarily store data to be written to the nonvolatile memory device 100 or data to be read from the nonvolatile memory device 100. In an example embodiment, the buffer memory 220 may be a component provided in the controller 200. In another example embodiment, the buffer memory 220 may be disposed outside the controller 200.

The advanced encryption device 260 may perform at least one of an encryption operation and a decryption operation on data input to the storage controller 210 using a symmetric-key algorithm. The advanced encryption device 260 may perform encryption and decryption of data using an advanced encryption standard (AES) algorithm. The advanced encryption device 260 may include an encryption module and a decryption module. In an example embodiment, the advanced encryption device 260 may be implemented in hardware/software/firmware. The advanced encryption device 260 may perform a self encryption disk (SED) function or a trusted computing group (TCG) security function. The SED function may store encrypted data in the nonvolatile memory device 100 or decrypt data encrypted from the nonvolatile memory device 100 using the encryption algorithm. This encryption/decryption operation may be performed using an internally generated encryption key. The TCG security function may provide a mechanism that enables access control to user data of the storage device 10. For example, the TCG security function may perform an authentication procedure between the external device and the storage device 10. In an example embodiment, the SED function or the TCG security function is optionally selectable.

Meanwhile, the nonvolatile memory device according to the example embodiment of the present disclosure may be implemented in a chip to chip (C2C) structure.

Figure 22:
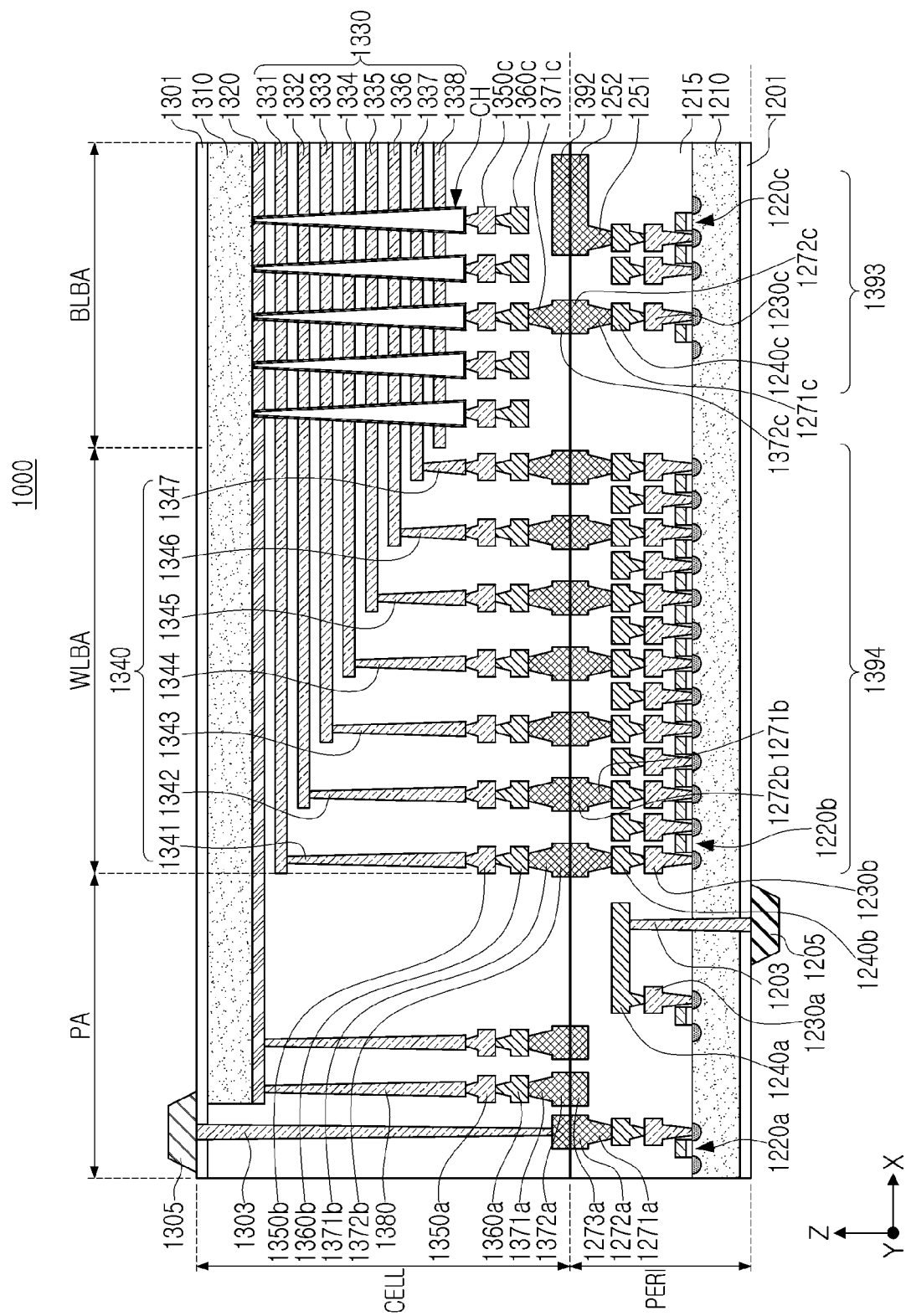
FIG. 22 is a diagram illustrating, by way of example, a nonvolatile memory device implemented in a C2C structure according to an example embodiment of the present disclosure.

FIG. 22 is a diagram illustrating, by way of example, a nonvolatile memory device 1000 implemented in a C2C structure according to an example embodiment of the present disclosure. Here, the C2C structure may mean that an upper chip including a cell area CELL is manufactured on a first wafer, and a lower chip including a peripheral circuit area PERI is manufactured on a second wafer different from the first wafer, and then the upper chip and the lower chip are connected to each other by a bonding method. For example, the bonding method may be a method of electrically connecting a bonding metal formed on an uppermost metal layer of the upper chip and a bonding metal formed on an uppermost metal layer of the lower chip. In an example embodiment, when the bonding metal is formed of copper (Cu), the bonding method may be a Cu-to-Cu bonding method. In another example embodiment, the bonding metal may be formed of aluminum (Al) or tungsten (W).

Each of the peripheral circuit area PERI and the cell area CELL of the nonvolatile memory device 1000 may include an outer pad bonding area PA, a wordline bonding area WLBA, and a bitline bonding area BLBA.

The peripheral circuit area PERI may include a first substrate 1210, an interlayer insulation layer 1215, a plurality of circuit elements 1220a, 1220b, and 1220c formed on the first substrate 1210, first metal layers 1230a, 1230b, and 1230c connected to each of the plurality of circuit elements 1220a, 1220b, and 1220c, and second metal layers 1240a, 1240b, and 1240c formed on the first metal layers 1230a, 1230b, and 1230c. In an example embodiment, the first metal layers 1230a, 1230b, and 1230c may be formed of tungsten having a relatively high specific resistance. In an example embodiment, the second metal layers 1240a, 1240b, and 1240c may be formed of copper having a relatively low specific resistance.

As illustrated in FIG. 22, the first metal layers 1230a, 1230b, and 1230c and the second metal layers 1240a, 1240b, and 1240c are illustrated, but the present disclosure will not be limited thereto. At least one metal layer may be further formed on the second metal layers 1240a, 1240b, and 1240c. At least some of the one or more metal layers formed on the second metal layers 1240a, 1240b, and 1240c may be formed of aluminum having a different specific resistance than that of the copper forming the second metal layers 1240a, 1240b, and 1240c.

In an example embodiment, the interlayer insulation layer 1215 may be disposed on the first substrate 1210 to cover the plurality of circuit elements 1220a, 1220b, and 1220c, the first metal layers 1230a, 1230b, and 1230c, and the second metal layers 1240a, 1240b, and 1240c. In an example embodiment, the interlayer insulation layer 1215 may include an insulating material such as silicon oxide or silicon nitride.

Lower bonding metals 1271b and 1272b may be formed on the second metal layer 1240b of the wordline bonding area WLBA. In the wordline bonding area WLBA, the lower bonding metals 1271b and 1272b of the peripheral circuit area PERI may be electrically interconnected to upper bonding metals 1371b and 1372b of the cell area CELL by the bonding method. In an example embodiment, the lower bonding metals 1271b and 1272b and the upper bonding metals 1371b and 1372b may be formed of aluminum, copper, tungsten, or the like. Additionally, the upper bonding metals 1371b and 1372b of the cell area CELL may be referred to as first metal pads, and the lower bonding metals 1271b and 1272b may be referred to as second metal pads.

The cell area CELL may include at least one memory block. In an example embodiment, the cell area CELL may include the second substrate 1310 and the common source line 1320. A plurality of wordlines 1331 to 1338 (1330) may be stacked on the second substrate 1310 along a direction (Z-axis direction) perpendicular to the upper surface of the second substrate 1310. In an example embodiment, the string select lines and the ground select line may be disposed on each of the upper and lower portions of the wordlines 1330. In an example embodiment, the plurality of wordlines 1330 may be disposed between the string select lines and the ground select line.

In the bitline bonding area BLBA, the channel structure CH may penetrate in a direction (Z-axis direction) perpendicular to the upper surface of the second substrate 1310 to form the wordlines 1330, the string select lines, and the ground select line. The channel structure CH may include a data storage layer, a channel layer, a buried insulation layer, and the like, and the channel layer may be electrically connected to a first metal layer 1350c and a second metal layer 1360c. For example, the first metal layer 1350c may be a bitline contact, and the second metal layer 1360c may be a bitline. In an example embodiment, the bitline 1360c may extend along a first direction (Y-axis direction) parallel to the upper surface of the second substrate 1310.

As illustrated in FIG. 22, an area in which the channel structure CH, the bitline 1360c, and the like are disposed may be defined as a bitline bonding area BLBA. In an example embodiment, the bitline 1360c may be electrically connected to the circuit elements 1220c providing a page buffer 1393 in the peripheral circuit area PERI in the bitline bonding area BLBA. For example, the bitline 1360c may be connected to upper bonding metals 1371c and 1372c in the peripheral circuit area PERI. Here, the upper bonding metals 1371c and 1372c may be connected to the lower bonding metals 1271c and 1272c connected to the circuit elements 1220c of the page buffer 1393. In the wordline bonding area WLBA, the wordlines 1330 may extend along a second direction (X-axis direction) parallel to the upper surface of the second substrate 1310 while being perpendicular to the first direction. In an example embodiment, the wordline bonding area WLBA may be connected to a plurality of cell contact plugs 1341 to 1347 (1340). For example, the wordlines 1330 and the cell contact plugs 1340 may be connected to each other through pads provided by at least some of the wordlines 1330 extending in different lengths along the second direction. In an example embodiment, the first metal layer 1350b and the second metal layer 1360b may be sequentially connected to the upper portion of the cell contact plugs 1340 connected to the wordlines 1330. In an example embodiment, the cell contact plugs 1340 may be connected to the peripheral circuit area PERI through the upper bonding metals 1371b and 1372b of the cell area CELL in the wordline bonding area WLBA and the lower bonding metal 1271b and 1272b of the peripheral circuit area PERI.

In an example embodiment, the cell contact plugs 1340 may be electrically connected to the circuit elements 1220b providing the row decoder 1394 in the peripheral circuit area PERI. In an example embodiment, the operating voltages of the circuit elements 1220b providing the row decoder 1394 may be different from the operating voltages of the circuit elements 1220c providing the page buffer 1393. For example, the operating voltage of the circuit elements 1220c providing the page buffer 1393 may be greater than that of the circuit elements 1220b providing the row decoder 1394.

A common source line contact plug 1380 may be disposed in the outer pad bonding area PA. In an example embodiment, the common source line contact plug 1380 may be formed of a conductive material such as a metal, a metal compound, or polysilicon. The common source line contact plug 1380 may be electrically connected to the common source line 1320. A first metal layer 1350a and a second metal layer 1360a may be sequentially stacked on the common source line contact plug 1380. For example, an area in which the common source line contact plug 1380, the first metal layer 1350a, and the second metal layer 1360a are disposed may be defined as the outer pad bonding area PA. The second metal layer 1360a may be electrically connected to an upper metal via 1371a. The upper metal via 1371a may be electrically connected to an upper metal pattern 1372a.

Meanwhile, input/output pads 1205 and 1305 may be disposed in the outer pad bonding area PA. Referring to FIG. 22, a lower insulating layer 1201 covering a lower surface of the first substrate 1210 may be formed under the first substrate 1210. In addition, a first input/output pad 1205 may be formed on the lower insulating layer 1201. In an example embodiment, the first input/output pad 1205 may be connected to at least one of the plurality of circuit elements 1220a, 1220b, and 1220c disposed in the peripheral circuit area PERI through a first input/output contact pad 1203. In an example embodiment, the first input/output pad 1205 may be separated from the first substrate 1210 by the lower insulating layer 1201. In addition, since a side insulating layer is disposed between the first input/output contact plug 1203 and the first substrate 1210, the first input/output contact plug 1203 and the first substrate 1210 may be electrically separated from each other.

Referring to FIG. 22, the upper insulating layer 1301 covering the upper surface of the second substrate 1310 may be formed on the second substrate 1310. In addition, a second input/output pad 1305 may be formed on the upper insulating layer 1301. In an example embodiment, the second input/output pad 1305 may be connected to at least one of the plurality of circuit elements 1220a, 1220b, and 1220c disposed in the peripheral circuit area PERI through a second input/output contact plug 1303, a lower metal pattern 1272a, and a lower metal via 1271a.

In an example embodiment, the second substrate 1310, the common source line 1320, and the like may not be disposed in the area where the second input/output contact plug 1303 is disposed. In addition, the second input/output pad 1305 may not overlap with the wordlines 1330 in a third direction (Z-axis direction). Referring to FIG. 16, the second input/output contact plug 1303 may be separated from the second substrate 1310 in a direction parallel to the upper surface of the second substrate 1310. Also, the second input/output contact plug 1303 may penetrate through the interlayer insulating layer 1315 of the cell area CELL to be connected to the second input/output pad 1305. In an example embodiment, the second input/output pad 1305 may be electrically connected to the circuit element 1220a.

In an example embodiment, the first input/output pad 1205 and the second input/output pad 1305 may be selectively formed. For example, the nonvolatile memory device 1000 may include only the first input/output pad 1205 disposed on the first substrate 1210, or only the second input/output pad 1305 disposed on the second substrate 1310. In another example embodiment, the nonvolatile memory device 1000 may include both the first input/output pad 1205 and the second input/output pad 1305.

The metal pattern of the uppermost metal layer may exist as a dummy pattern in each of the outer pad bonding area PA and the bitline bonding area BLBA included in each of the cell area CELL and the peripheral circuit area PERI, or the uppermost metal layer may be empty.

In the nonvolatile memory device 1000 according to the example embodiment of the present disclosure, a lower metal pattern 1273a having the same shape as the upper metal pattern 1372a of the cell area CELL may be formed on the uppermost metal layer of the peripheral circuit area PERI to correspond to the upper metal pattern 1372a formed on the uppermost metal layer of the cell area CELL in the outer pad bonding area PA. The lower metal pattern 1273a formed on the uppermost metal layer of the peripheral circuit area PERI may not be connected to a separate contact in the peripheral circuit area PERI. Similarly, the upper metal pattern having the same shape as the lower metal pattern of the parallel circuit area PERI may be formed on the upper metal layer of the cell area CELL to correspond to the lower metal pattern formed on the uppermost metal layer of the peripheral circuit area PERI in the outer pad bonding area PA. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

Lower bonding metals 1271b and 1272b may be formed on the second metal layer 1240b of the wordline bonding area WLBA. In the wordline bonding area WLBA, the lower bonding metals 1271b and 1272b of the peripheral circuit area PERI may be electrically interconnected to upper bonding metals 1371b and 1372b of the cell area CELL by the bonding method.

In addition, lower bonding metals 1251 and 1252 may be formed on the metal layer of the bitline bonding area BLBA. In the bitline bonding area BLBA, an upper metal pattern 1392 having the same shape as the lower metal pattern 1252 of the peripheral circuit area PERI may be formed on the uppermost metal layer of the cell area CELL, corresponding to the lower metal pattern 1252 formed on an uppermost metal layer of the peripheral circuit area PERI. In an exemplary example embodiment, a contact may not be formed on the upper metal pattern 1392 formed on the uppermost metal layer of the cell area CELL.

In the exemplary example embodiment, a reinforced metal pattern having the same cross-periodal shape as the formed metal pattern may be formed on the uppermost metal layer of the other one of the cell area CELL and the peripheral circuit area PERI, corresponding to the metal pattern formed on the uppermost metal layer of one of the cell area CELL and the peripheral circuit area PERI Contacts may not be formed in the reinforced metal pattern.

The nonvolatile memory device according to the example embodiment of the present disclosure may include a voltage generator for regulating each of the plurality of output levels using a single OP-AMP. The voltage generator of the present disclosure may include a feedback network including one OP-AMP and a plurality of pass transistors, feedback resistors, and transmission gates (switches).

In the method of generating a voltage of a nonvolatile memory device according to an example embodiment of the present disclosure, a plurality of output voltages may be generated by regulating a plurality of different output levels through a single OP-AMP. In particular, the voltage generation method may regulate each of a plurality of output voltages using one OP-AMP. In an example embodiment, each feedback resistor is provided to generate each output voltage. In an example embodiment, each output voltage level may be controlled by controlling a transmission gate (switch).

A NAND flash memory according to an example embodiment of the present disclosure may configure a plurality of output DC voltage generators using a single OP-AMP. In an example embodiment, a feedback network of a plurality of voltage generators may be configured by sharing a single OP-AMP.

A method of operating a NAND flash memory according to an example embodiment of the present disclosure may control an output voltage of a plurality of DC voltage generators using a single OP-AMP. In an example embodiment, the plurality of output voltages may be simultaneously controlled by a common signal. In an example embodiment, the detection and control of the output voltage may be sequentially controlled by a clock signal.

As set forth above, according to an example embodiment of the present disclosure, a nonvolatile memory device, a storage device having the same, and an operating method thereof may generate a plurality of wordline voltages for each zone using a single operational amplifier, thereby reducing a chip size.

On the other hand, the contents of the present disclosure described above are only specific examples for carrying out the invention. The present disclosure will include not only concrete and practical means itself, but also technical ideas which are abstract and conceptual ideas that may be used as device technology.

What is claimed is:

1. A nonvolatile memory device, comprising:
   an operational amplifier configured to compare a reference voltage with a voltage of a feedback node;
   a first feedback network circuit configured to generate a first output voltage by dividing an input voltage in response to an output voltage of the operational amplifier, to apply the first output voltage to a first set of wordlines, and to transmit a first feedback voltage corresponding to the first output voltage to the feedback node in response to a first feedback signal;
   a second feedback network circuit configured to generate a second output voltage by dividing the input voltage in response to the output voltage of the operational amplifier, to apply the second output voltage to a second set of wordlines, and to transmit a second feedback voltage corresponding to the second output voltage to the feedback node in response to a second feedback signal; and
   a third feedback network circuit configured to generate a third output voltage by dividing the input voltage in response to the output voltage of the operational amplifier, to apply the third output voltage to a third set of wordlines, and to transmit a third feedback voltage corresponding to the third output voltage to the feedback node in response to a third feedback signal,
   wherein each of the first to third feedback network circuits include two resistors connected in series and a switch, and divides the input voltage by two resistors,
   wherein one end of the switch is connected between the two resistors connected in series, and the other end of the switch is connected to the feedback node.

2. The nonvolatile memory device of claim 1, wherein the reference voltage varies corresponding to the output voltage transmitted to the feedback node.

3. The nonvolatile memory device of claim 1, wherein the first to third feedback network circuits simultaneously output an output voltage at a predetermined level during a set-up period.

4. The nonvolatile memory device of claim 3, wherein after the set-up period, the first to the third feedback network circuits sequentially perform a regulation operation in response to a corresponding feedback signal.

5. The nonvolatile memory device of claim 3, wherein after the set-up period, the first to third feedback network circuits sequentially discharge the output voltage in response to a corresponding feedback signal.

6. The nonvolatile memory device of claim 5, further comprising:
   a discharging circuit configured to discharge one of the first output voltage, the second output voltage, and the third output voltage in response to the corresponding feedback signal.

7. The nonvolatile memory device of claim 1, wherein the first feedback network circuit includes:
   a first transistor connected between a voltage terminal outputting the input voltage and a first output node outputting the first output voltage;
   a first switch configured to connect a first node outputting the output voltage of the operational amplifier and a gate of the first transistor in response to the first feedback signal;
   a second switch configured to connect the gate of the first transistor and a ground terminal in response to an inverted signal of the first feedback signal;
   a third switch configured to connect a second node and the feedback node in response to the first feedback signal;
   a fourth switch configured to connect a third node and the ground terminal in response to the first feedback signal;
   a first resistor connected between the first output node and the second node; and
   a second resistor connected between the second node and the third node.

8. The nonvolatile memory device of claim 1, wherein the second feedback network circuit includes:
   a second transistor connected between a voltage terminal outputting the input voltage and a second output node outputting the second output voltage;
   a fifth switch configured to connect a first node outputting the output voltage of the operational amplifier and a gate of the second transistor in response to the second feedback signal;
   a sixth switch configured to connect the gate of the second transistor and a ground terminal in response to an inverted signal of the second feedback signal;
   a seventh switch configured to connect a fourth node and the feedback node in response to the second feedback signal;
   an eighth switch configured to connect a fifth node and the ground terminal in response to the second feedback signal;
   a third resistor connected between the second output node and the fourth node; and
   a fourth resistor connected between the fourth node and the fifth node.

9. The nonvolatile memory device of claim 1, wherein the third feedback network circuit includes:
   a third transistor connected between a voltage terminal outputting the input voltage and a third output node outputting the third output voltage;

a ninth switch configured to connect a first node outputting the output voltage of the operational amplifier and a gate of the third transistor in response to the third feedback signal;

a tenth switch configured to connect the gate of the third transistor and a ground terminal in response to an inverted signal of the third feedback signal;

an eleventh switch configured to connect a sixth node and the feedback node in response to the third feedback signal;

a twelfth switch configured to connect a seventh node and the ground terminal in response to the third feedback signal;

a fifth resistor connected between the third output node and the sixth node; and a sixth resistor connected between the sixth node and the seventh node.

* * * * *